(12) United States Patent
Stauth et al.

(10) Patent No.: US 7,518,354 B2
(45) Date of Patent: Apr. 14, 2009

(54) MULTI-SUBSTRATE INTEGRATED SENSOR

(75) Inventors: Jason Stauth, Concord, NH (US);
Richard Dickinson, Concord, NH (US);
Glenn Forrest, Nottingham, NH (US);
Ravi Vig, Bow, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 0 days.

(21) Appl. No.: 11/767,631

(22) Filed: Jun. 25, 2007

(65) Prior Publication Data
US 2007/0247146 A1  Oct. 25, 2007

Related U.S. Application Data

(62) Division of application No. 10/364,442, filed on Feb. 11, 2003, now Pat. No. 7,259,545.

(51) Int. Cl.
*G01R 15/20* (2006.01)
(52) U.S. Cl. .............. 324/117 R; 324/117 H; 324/126; 324/127
(58) Field of Classification Search ............. None
See application file for complete search history.

(56) References Cited

U.S. PATENT DOCUMENTS

| | | |
|---|---|---|
| 4,343,026 A | 8/1982 | Griffith et al. |
| 4,525,668 A | 6/1985 | Lienhard et al. |
| 4,596,950 A | 6/1986 | Lienhard et al. |
| 4,691,259 A | 9/1987 | Imakoshi |
| 4,712,064 A | 12/1987 | Eckardt et al. |
| 4,823,075 A | 4/1989 | Alley |
| 4,847,584 A | 7/1989 | Pant |
| 4,926,116 A * | 5/1990 | Talisa ............... 324/117 |
| 4,937,521 A | 6/1990 | Yoshino et al. |

(Continued)

FOREIGN PATENT DOCUMENTS

DE    4212737    7/1993

(Continued)

OTHER PUBLICATIONS

PCT Search Report and Written Opinion of the ISA for PCT/US2005/029982 dated Jan. 18, 2006.

(Continued)

*Primary Examiner*—Vinh P Nguyen
(74) *Attorney, Agent, or Firm*—Daly, Crowley, Mofford & Durkee, LLP

(57) ABSTRACT

An electronic circuit includes a first substrate having a first substrate surface and a device supported by the first substrate surface. The device is selected from among a passive electronic component and an active electronic component. The electronic circuit also includes a second substrate having a second substrate surface and a conductor proximate to the second substrate. The electronic circuit also includes a magnetic field transducer disposed over the conductor and coupled to the device and an insulating layer disposed between the conductor and the second substrate. The conductor is adapted to carry an electrical current to generate a first magnetic field. The electronic circuit is responsive to the first magnetic field. In some embodiments, the conductor is a secondary conductor and the circuit further includes a primary conductor disposed proximate to the magnetic field transducer and an insulating layer disposed between the primary conductor and the second substrate.

21 Claims, 12 Drawing Sheets

U.S. PATENT DOCUMENTS

| | | | |
|---|---|---|---|
| 4,939,448 A | 7/1990 | Gudel | |
| 4,939,449 A | 7/1990 | Cattaneo et al. | |
| 4,939,459 A | 7/1990 | Akachi et al. | |
| 5,041,780 A | 8/1991 | Rippel | |
| 5,049,809 A | 9/1991 | Wakatuski et al. | |
| 5,227,721 A | 7/1993 | Kataoka et al. | |
| 5,500,590 A | 3/1996 | Pant | |
| 5,561,366 A | 10/1996 | Takahashi et al. | |
| 5,561,368 A | 10/1996 | Dovek et al. | |
| 5,570,034 A | 10/1996 | Needham et al. | |
| 5,621,377 A | 4/1997 | Dettmann et al. | |
| 5,719,494 A | 2/1998 | Dettmann et al. | |
| 5,831,426 A | 11/1998 | Black, Jr. et al. | |
| 5,877,705 A | 3/1999 | Sampey | |
| 5,952,825 A | 9/1999 | Wan | |
| 6,002,553 A | 12/1999 | Stearns et al. | |
| 6,031,273 A | 2/2000 | Torok et al. | |
| 6,094,330 A | 7/2000 | Criniti et al. | |
| 6,300,617 B1 | 10/2001 | Daughton et al. | |
| 6,315,875 B1 | 11/2001 | Sasaki | |
| 6,316,931 B1 | 11/2001 | Nakagawa et al. | |
| 6,323,634 B1 | 11/2001 | Nakagawa et al. | |
| 6,392,852 B1 | 5/2002 | Sasaki | |
| 6,404,191 B2 | 6/2002 | Daughton et al. | |
| 6,411,078 B1 | 6/2002 | Nakagawa et al. | |
| 6,429,640 B1 | 8/2002 | Daughton et al. | |
| 6,433,981 B1 | 8/2002 | Fletcher et al. | |
| 6,437,558 B2 | 8/2002 | Li et al. | |
| 6,445,171 B2 | 9/2002 | Sandquist et al. | |
| 6,459,255 B1 | 10/2002 | Tamai et al. | |
| 6,462,531 B1 * | 10/2002 | Ohtsuka | 324/117 H |
| 6,462,541 B1 | 10/2002 | Wang et al. | |
| 6,566,856 B2 | 5/2003 | Sandquist et al. | |
| 6,583,629 B1 | 6/2003 | Stokes et al. | |
| 6,591,481 B2 | 7/2003 | Shimazawa et al. | |
| 6,642,705 B2 | 11/2003 | Kawase | |
| 6,657,826 B2 | 12/2003 | Shimazawa et al. | |
| 6,667,682 B2 | 12/2003 | Wan et al. | |
| 6,683,448 B1 * | 1/2004 | Ohtsuka | 324/117 H |
| 6,721,140 B2 | 4/2004 | Inoue et al. | |
| 6,759,841 B2 | 7/2004 | Goto et al. | |
| 6,769,166 B1 | 8/2004 | Blanchard | |
| 6,781,358 B2 * | 8/2004 | Goto et al. | 324/117 H |
| 6,781,359 B2 | 8/2004 | Stauth et al. | |
| 7,075,287 B1 * | 7/2006 | Mangtani et al. | 324/117 H |
| 7,166,807 B2 * | 1/2007 | Gagnon et al. | 174/536 |
| 7,248,045 B2 | 7/2007 | Shoji | |
| 7,259,545 B2 | 8/2007 | Stauth et al. | |
| 2004/0155644 A1 | 8/2004 | Stauth et al. | |
| 2006/0071655 A1 | 4/2006 | Shoji | |
| 2006/0091993 A1 | 5/2006 | Shoji | |
| 2006/0114098 A1 | 6/2006 | Shoji | |
| 2006/0145690 A1 | 7/2006 | Shoji | |
| 2006/0170529 A1 | 8/2006 | Shoji | |
| 2006/0291106 A1 | 12/2006 | Shoji | |
| 2007/0044370 A1 | 3/2007 | Shoji | |
| 2007/0076332 A1 | 4/2007 | Shoji et al. | |
| 2007/0090825 A1 | 4/2007 | Shoji | |
| 2007/0096716 A1 | 5/2007 | Shoji | |
| 2007/0188946 A1 | 8/2007 | Shoji | |

FOREIGN PATENT DOCUMENTS

| | | |
|---|---|---|
| DE | 196 50 078 | 6/1998 |
| EP | 0 539 081 A1 | 4/1993 |
| EP | 0 710 850 | 4/1993 |
| EP | 0539081 | 4/1993 |
| JP | 57187671 | 5/1981 |
| JP | HEI 02-238372 | 9/1990 |
| JP | HEI 05-010979 | 1/1993 |
| WO | WO 2004/109725 | 12/2004 |

OTHER PUBLICATIONS

PCT Search Report; PCT Application No. PCT/US03/34141 dated Jun. 17, 2004.

Data Sheet; "High-Speed Digital Isolators, AduM1100AR/ AduM1100BR;" as published by Analog Devices, Inc.; 2001, pp. 1-12.

"Utilization of GMR Materials. Analog Bridge Output Devices;" NVE Corporation on website: www.nve.com/technical/explinations//Bridge.html, 3 pages. 1996.

Pernia et al., "Characteristics and Design of a Current Sensor Using Multilayer Co/Ni Structures", IEEE, 1998, pp. 414-419.

Office Action dated May 26, 2008 for Japanese Appl. No. 2004-568309, filed Aug. 11, 2005, 1 page.

Response to Office Action dated May 26, 2008 filed on Aug. 26, 2008 for Japanese Appl. No. 2004-568309, 16 pages.

Office Action dated Apr. 25, 2008 for European Appl. No. 05794713. 7, 7 pages.

File downloaded from PAIR for U.S. Appl. No. 10/364,442, filed Feb. 11, 2003 U.S. Patent No. 7,259,545, issued Aug. 21, 2007, file through Oct. 31, 2008, 595 pages.

File downloaded from PAIR for U.S. Appl. No. 10/962,889, filed Oct. 12, 2004, file through Oct. 31, 2008, 243 pages.

File downloaded from PAIR for U.S. Appl. No. 11/335,944, filed Jan. 20, 2006, file through Oct. 31, 2008, 199 pages.

* cited by examiner

MULTI-SUBSTRATE INTEGRATED SENSOR

CROSS-REFERENCE TO RELATED APPLICATIONS

This application is a Divisional Application of and claims the benefit of U.S. patent application Ser. No. 10/364,442 filed Feb. 11, 2003, now U.S. Pat. No. 7,259,545, which is incorporated herein by reference in its entirety.

STATEMENT REGARDING FEDERALLY SPONSORED RESEARCH

Not Applicable.

FIELD OF THE INVENTION

This invention relates generally to electrical sensors and, more particularly, to a miniaturized integrated sensor having a magnetic field transducer and a conductor disposed on a substrate. The integrated sensor can be used to provide a current sensor, an isolator, or a magnetic field sensor.

BACKGROUND OF THE INVENTION

As is known in the art, conventional current sensors can be arranged in either an open loop or a closed loop configuration. An "open loop" current sensor includes a magnetic field transducer in proximity to a current-carrying, or primary, conductor. The magnetic field transducer provides an output signal proportional to the magnetic field generated by current passing through the primary conductor.

A "closed loop" current sensor additionally includes a secondary conductor in proximity to the magnetic field transducer. A current is passed through the secondary conductor in order to generate a magnetic field that opposes and cancels the magnetic field generated by a current passing through the primary conductor. Thus, the magnetic field in the vicinity of the magnetic field transducer is substantially zero. The current passed through the secondary conductor is proportional to the magnetic field in the primary conductor and thus, to the primary current. The closed loop configuration generally provides improved accuracy over the open loop configuration. This is because hysteresis effects associated with the transducer are eliminated by maintaining the magnetic field on the transducer at approximately zero gauss. The closed loop configuration also generally provides improved linearity in comparison with the open loop configuration, as well as increased dynamic range. These improvements are further described below.

Some conventional open and closed loop current sensors contain integrated electronics. For example, an amplifier can be coupled to and provided in an integrated package with the magnetic field transducer. However, in conventional open and closed loop current sensors, the secondary conductor and/or the primary conductor are not integrated with the magnetic field transducer.

One type of conventional current sensor uses a Hall effect transducer as the magnetic field transducer. Typical current sensors of this type include a Hall effect transducer mounted on a dielectric material, for example a circuit board. Typically, a ferrous core is used in proximity to the Hall effect transducer. The secondary conductor and/or the primary conductor are adjacent to, or disposed around, the ferrous core. In part because this conventional closed loop current sensor is relatively large, it suffers from relatively low bandwidth.

Another type of conventional current sensor uses a magnetoresistance element as the magnetic field transducer. The magnetoresistance element changes resistance in response to a magnetic field. A fixed electrical current is directed through the magnetoresistance element, thereby generating a voltage output signal proportional to the magnetic field. When used in an open loop current sensor configuration, the voltage output signal has a magnitude proportional to the magnetic field generated by current passing through the primary conductor. Conventional current sensors of this type use an anisotropic magnetoresistance (AMR) element mounted on a dielectric material, for example a circuit board. The secondary conductor and/or the primary conductor are adjacent to, or disposed on, the dielectric material, for example as circuit board traces. As with the previously described conventional closed loop current sensor, in part because this conventional closed loop current sensor is relatively large, it suffers from relatively low bandwidth.

Various parameters characterize the performance of current sensors, including sensitivity and linearity. Sensitivity is related to a change in the resistance of the magnetoresistance element or the change in output voltage from the Hall effect transducer in response to a change in magnetic field. Linearity is related to the degree to which the resistance of the magnetoresistance element or the output voltage from the Hall effect transducer varies in direct proportion to the magnetic field. Important considerations in the use of both types of magnetic field transducers include the effect of stray or external magnetic fields on the current sensor performance.

Typical current sensors tend to be undesirably large, both in terms of height and circuit board area, due in part to the secondary conductor and/or primary conductor being separate from the magnetic field transducer. Such devices also tend to suffer inaccuracies due, in part, to variation of relative position of the primary conductor, the magnetic field transducer, and the secondary conductor. It would, therefore, be desirable to provide a current sensor having a reduced size and improved accuracy.

While conventional current sensors are described above as having particular disadvantages, it will be appreciated that conventional external magnetic field sensors and also conventional electrical signal isolators suffer from the same disadvantages. It would, therefore, be desirable to provide an external magnetic field sensor and also an electrical signal isolator having reduced size and improved accuracy.

SUMMARY OF THE INVENTION

In accordance with one aspect of the present invention, an electronic circuit includes a first substrate having a first substrate surface and a device supported by the first substrate surface. The device is selected from among a passive electronic component and an active electronic component. The electronic circuit also includes a second substrate having a second substrate surface and a conductor proximate to the second substrate. The electronic circuit also includes a magnetic field transducer disposed over the conductor and coupled to the device. The electronic circuit also includes an insulating layer disposed between the conductor and the second substrate. The conductor is adapted to carry an electrical current to generate a first magnetic field. The electronic circuit is responsive to the first magnetic field.

With this arrangement, the electronic circuit can be used to provide an open loop current sensor, wherein a current passing through the conductor generates a magnetic field to which the magnetic field transducer is responsive. This arrangement can also be used to provide a magnetic field sensor, wherein the magnetic field transducer is responsive to external magnetic fields. Also with this arrangement, the electronic circuit can provide an open loop signal isolator, wherein an electrical signal coupled to the conductor generates a magnetic field to which the magnetic field transducer is responsive.

In some embodiments of the present invention, the conductor is a secondary conductor and the circuit further includes a primary conductor disposed proximate to the magnetic field transducer and an insulating layer disposed between the primary conductor and the second substrate.

With these arrangements, the electronic circuit can provide a closed loop current sensor or a closed loop signal isolator responsive to an electrical signal on the primary conductor. In some closed loop arrangements, an amplifier can provide a secondary current to the secondary conductor to cancel the magnetic field generated by the primary conductor and the secondary current provides an output signal, which is indicative of the magnetic field generated by the primary current.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Figure 1:
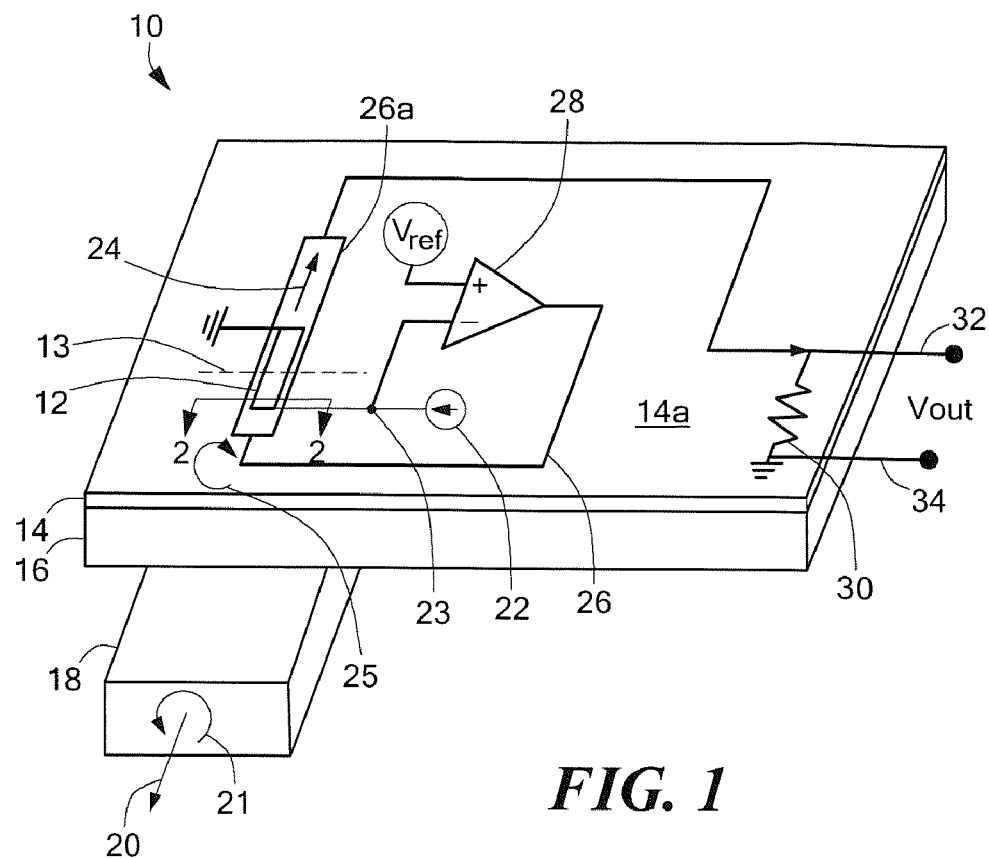
FIG. 1 is an isometric view of a closed loop current sensor in accordance with the present invention.

Referring to FIG. 1, an electronic circuit 10 includes a silicon substrate 14, a magnetic field transducer 12 disposed over a surface 14a of the silicon substrate, and a conductor 26 disposed over the surface 14a of the silicon substrate proximate to the magnetic field transducer 12. With this arrangement, an integrated circuit is provided which is suitable for various applications, such as a current sensor (FIGS. 1, 1A, 3 and 4), a magnetic field sensor (FIGS. 6 and 6A), and a signal isolator (FIGS. 7 and 7A).

The electronic circuit 10 can be used in open loop configurations in which a current passes through the conductor 26 (see FIG. 1A) or in closed loop configurations in which a further conductor 18 is also used. The conductor 18 is isolated from the silicon substrate 14 by a dielectric 16, as shown. In closed loop applications, in which both the conductor 18 and conductor 26 are used, the conductor 18 is referred to as the primary conductor and conductor 26 is referred to as the secondary conductor.

The electronic circuit 10 provides a closed loop current sensor. The magnetic field transducer 12 is shown here as a magnetoresistance element, such as a giant magnetoresistance (GMR) element 12.

In operation, a primary current 20 flows through the primary conductor 18, thereby generating a primary magnetic field 21, and a secondary current 24 flows through the secondary conductor 26, thereby generating a secondary magnetic field 25. Because the secondary current 24 is opposite in direction to the primary current 20, the secondary magnetic field 25 is opposite in direction to the primary magnetic field 21.

The secondary conductor 26 is shown having a secondary conductor portion 26a in proximity to, here shown under, the magnetic field transducer 12. Though shown to be wider, the conductor portion 26a can be wider, narrower, or the same width as the rest of the secondary conductor 26.

A current source 22, here integrated in the silicon substrate 14, provides a current through the magnetic field transducer 12 and, therefore, generates a voltage at node 23 having a magnitude related to the magnetic field experienced by the magnetic field transducer 12. An amplifier 28, also here integrated in the silicon substrate 14 and coupled to the magnetic field transducer 12, provides the secondary current 24 to the secondary conductor 26 in response to the voltage at node 23. While the current source 22 and the amplifier 28 can be integrated into the silicon substrate 14, in other embodiments, the current source 22 and the amplifier 28 are disposed on the surface of the silicon substrate, for example as separate silicon wafers.

A reference voltage $V_{ref}$ provides a bias voltage to the amplifier 28. In one particular embodiment, the reference voltage $V_{ref}$ is generated to be the same voltage as the voltage that appears at the node 23 in the presence of zero primary current 20. Therefore, in the presence of zero primary current 20, the output of the amplifier 28 is zero. The reference voltage $V_{ref}$ can be provided in a variety of ways. For example, in one particular embodiment, a second magnetic field transducer (not shown) in conjunction with a second current source (not shown), having an arrangement similar to the magnetic field transducer 12 and the current source 22, can be used to provide the reference voltage $Y_{ref}$. With this particular arrangement, the second magnetic field transducer (not shown) is fabricated to be magnetically unresponsive, or is otherwise magnetically shielded, so that the reference voltage $V_{ref}$ does not change in the presence of magnetic fields or in the presence of either the primary current 20 or the secondary current 24. For another example, in an alternate embodiment, the reference voltage $V_{ref}$ is generated by a digitally programmable D/A converter, which can be set during manufacture to achieve a desired reference voltage $V_{ref}$. However, it will be understood by those of ordinary skill in the art that other embodiments can be used to provide the reference voltage $V_{ref}$ including, but not limited to, a diode, a zener diode, and a bandgap reference.

While several arrangements are described above for generating the reference voltage $V_{ref}$, it will be appreciated that there are advantages to generating the reference voltage $V_{ref}$ with an embodiment with which the changes of the reference voltage $V_{ref}$ due to temperature track the changes in the voltage at the node 23 due to temperature. With a temperature tracking arrangement, temperature effects upon the electronic circuit 10 are reduced.

The magnetic field transducer 12 is responsive to magnetic fields along a response axis 13 and has substantially no response, or very little response, to magnetic fields in directions orthogonal to the response axis 13. For a magnetic field at another angle relative to the response axis 13, a component of the magnetic field is along the response axis 13, and the magnetic field transducer is responsive to the component.

The magnetic field transducer 12 is polarized, so that the "direction" of its response to magnetic fields is dependent on the direction of the magnetic field along response axis 13. More particularly, the response, here resistance change, of the illustrative GMR device 12 changes in one direction when the magnetic field is in one direction along the response axis 13, and changes in the other direction when the magnetic field is in the other direction along the response axis 13. The magnetic field transducer 12 is polarized such that its resistance increases with an increase in the secondary current 24.

The magnetic field transducer 12 is oriented on the silicon substrate 14 such that the response axis 13 is aligned with both the secondary magnetic field 25 and the primary magnetic field 21. Thus, the magnetic field experienced by the magnetic field transducer 12 is the sum of the secondary magnetic field 25 and the primary magnetic field 21 along the response axis 13. Since the secondary magnetic field 25 is opposite in direction to the primary magnetic field 21 along the response axis 13, the secondary magnetic field 25 tends to cancel the primary magnetic field 21. The amplifier 28 generates the secondary current 24 in proportion to the voltage at node 23, and thus also in proportion to the primary magnetic field 21. In essence, if the voltage at the node 23 tends to decrease, the secondary current 24 tends to increase to cause the voltage at the node 23 not to change. Therefore, amplifier 28 provides the secondary current 24 at a level necessary to generate a secondary magnetic field 25 sufficient to cancel the primary magnetic field 21 along the response axis 13 so that the total magnetic field along the response axis 13 is substantially zero gauss.

It will be appreciated by those of ordinary skill in the art that the total magnetic field experienced by the magnetic field transducer 12 can also include external magnetic fields, such as the earth's magnetic field. The effect of external magnetic fields is discussed below in conjunction with FIG. 10. As will become apparent, the effect of external magnetic fields on the sensor 10 can be eliminated with appropriate magnetic shielding (not shown).

The secondary current 24 passes through a resistor 30 thereby generating an output voltage, Vout, between output terminals 32, 34, in proportion to the secondary current 24. With this arrangement, the output voltage, Vout, is proportional to the secondary magnetic field 25 necessary to cancel the primary magnetic field 21 and is thus, proportional to the primary current 20, as desired. It will be appreciated by those of ordinary skill in the art that the current sensor output alternatively may be provided in the form of a current or a buffered or otherwise amplified signal.

The magnetic field transducer 12, the secondary conductor 26, the current source 22, and the resistor 30 can be fabricated on the silicon substrate 14 using known silicon integrated circuit fabrication techniques. For example, the amplifier 28 can be fabricated by known gas diffusion techniques and the secondary conductor 26 can be fabricated by known metal sputtering techniques. However, depending upon the type of magnetic field transducer 12, it may be difficult to fabricate the magnetic field transducer 12 using silicon fabrication techniques that are compatible with fabrication techniques used to form the amplifier 28. Thus, in an alternate embodiment shown in FIG. 8, the magnetic field transducer 12 and the secondary conductor portion 26a are fabricated on another substrate, for example a ceramic substrate, while the amplifier 28, the resistor 30, the current source 22, and the remaining secondary conductor 26 are fabricated on the silicon substrate 14. In this alternate embodiment, the two substrates are interconnected with wire bonds or the like.

While the closed loop current sensor 10 is shown having the primary conductor 18 separate from the silicon substrate 14, in another embodiment, the primary conductor 18 is disposed on the silicon substrate 14 in proximity to the magnetic field transducer 12.

While the magnetic field transducer 12 is shown as a GMR device 12, other magnetic field transducers, for example, an anisotropic magnetoresistance (AMR) device or a Hall effect transducer can also be used. Also, the magnetic field transducer 12 can be disposed on the surface 14a of the silicon substrate 14 so as to be aligned in other directions. Furthermore, while a silicon substrate 14 is shown, a ceramic substrate can also be used with this invention. Use of a ceramic substrate requires fabrication techniques different than those of the silicon substrate 14, which techniques are known to those of ordinary skill in the art.

Certain parameters characterize the performance of magnetic field transducers, including linearity, sensitivity and offset. For a magnetoresistance element, linearity refers to the proportionality of a change in resistance to a change in the magnetic field experienced by the magnetoresistance element. The relationship between resistance change and magnetic field change is substantially linear over a range of magnetic fields, but becomes non-linear at higher magnetic fields. Errors referred to herein as linearity errors, can occur when the magnetic field transducer 12 operates beyond its linear range. Since small magnetic fields generally result in small linearity errors, the magnetic field transducer 12, experiencing substantially zero magnetic field in the closed loop current sensor 10, has a small linearity error.

For a magnetoresistance element, sensitivity refers to a functional relationship between the resistance change and the magnetic field experienced by the magnetoresistance element. The functional relationship can be represented graphically as a transfer curve having a slope, and the slope at any particular magnetic field (i.e., at any particular point on the transfer curve) corresponds to the sensitivity at that magnetic field. The zero crossing of the transfer curve corresponds to the offset error. Because the transfer curve of a magnetic field transducer has a slope and offset that can vary, sensitivity and offset errors can occur. One factor that can affect offset is hysteresis of the transfer curve. The hysteresis is related to large magnetic fields, and thus, the magnetic field transducer 12, experiencing substantially zero magnetic field, has a small offset error due to hysteresis. Other factors that can affect sensitivity and offset are described below.

The closed loop current sensor 10 generally provides smaller errors than open loop current sensors described below. In the closed loop current sensor 10, the magnetic field transducer 12 experiences nearly zero magnetic field along the response axis 13, thereby reducing the effect of linearity errors. Sensitivity errors are similarly reduced by the closed loop current sensor 10. Offset errors due to hysteresis are also reduced as described above. However, the closed loop current sensor 10 provides little improvement upon offset errors generated by other effects, for example manufacturing effects or temperature drift effects. These offset errors can, however, be reduced by techniques described in conjunction with FIGS. 3 and 4.

The closed loop current sensor 10 provides yet another benefit. Because the magnetic field experienced by the magnetic field transducer 12 is substantially zero, the closed loop current sensor 10 can be used to detect a large primary current 20 having a large primary magnetic field 21 which would otherwise degrade the linearity of, or saturate, the magnetic field transducer 12. The range of primary currents over which the closed loop current sensor 10 can be used is limited only by the amount of secondary current 24 that can be generated by the amplifier 28 and carried by the secondary conductor 26.

Figure 1A:
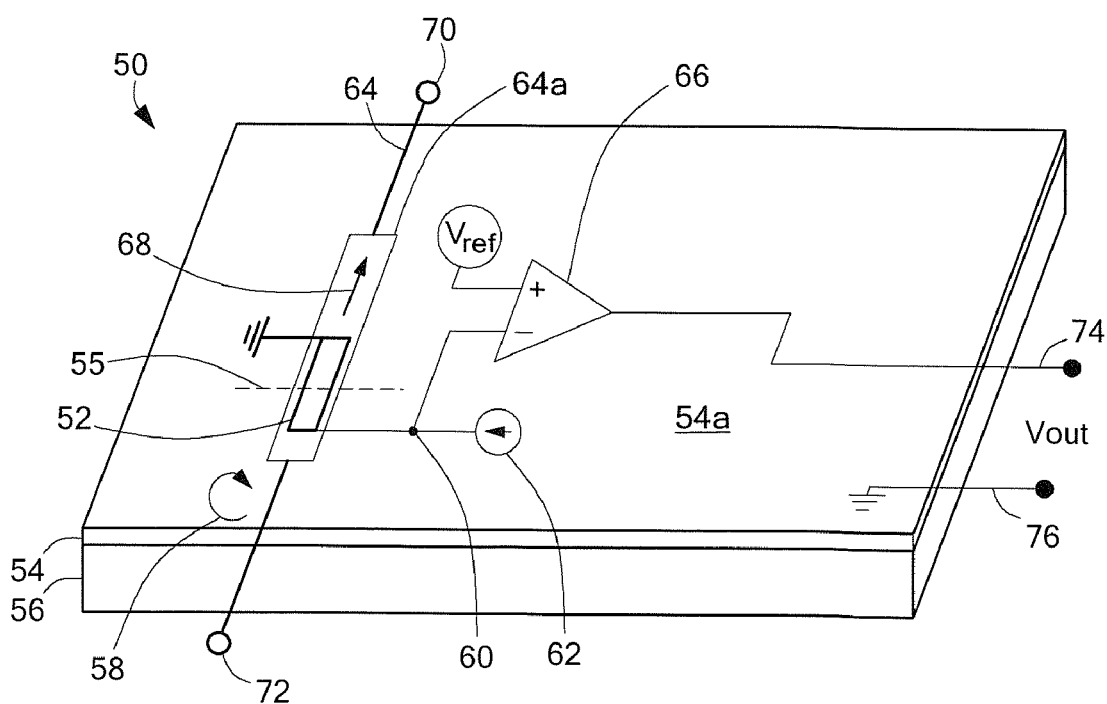
FIG. 1A is an isometric view of an open loop current sensor in accordance with the present invention.

Referring now to FIG. 1A, an electronic circuit 50 in the form of an open loop current sensor, includes a magnetic field transducer 52 disposed on a silicon substrate 54. Unless otherwise noted, components of FIG. 1A have the same structure, features and characteristics as like components in preceding figures. A conductor 64, having a conductor portion 64a, is disposed on the silicon substrate 54 proximate to the magnetic field transducer 52 and is similar in construction to conductor 26 of FIG. 1. A current 68 flows through the conductor 64, thereby generating a magnetic field 58 proportional to the current 68. The total magnetic field in the vicinity of the magnetic field transducer 52 is substantially equal to the magnetic field 58.

A current source 62 provides a current that passes through the magnetic field transducer 52, thereby generating a voltage at node 60. An amplifier 66 provides an output voltage, Vout, between output terminal 74 and output terminal 76, having a magnitude proportional to the magnetic field 58 experienced by the magnetic field transducer 52 and thus, also, proportional to the current 68 through the conductor 64.

As described above, a magnetic field transducer, here the magnetic field transducer 52, is a polarized device. The magnetic field transducer 52 is shown here to be a GMR device 52 having a resistance proportional to magnetic field. Thus, the response, here resistance, of the magnetic field transducer 52 changes in one direction when the magnetic field 58 is in one direction along the response axis 55, and changes in the other direction when the magnetic field 58 is in the other direction along the response axis 55.

Figure 2:
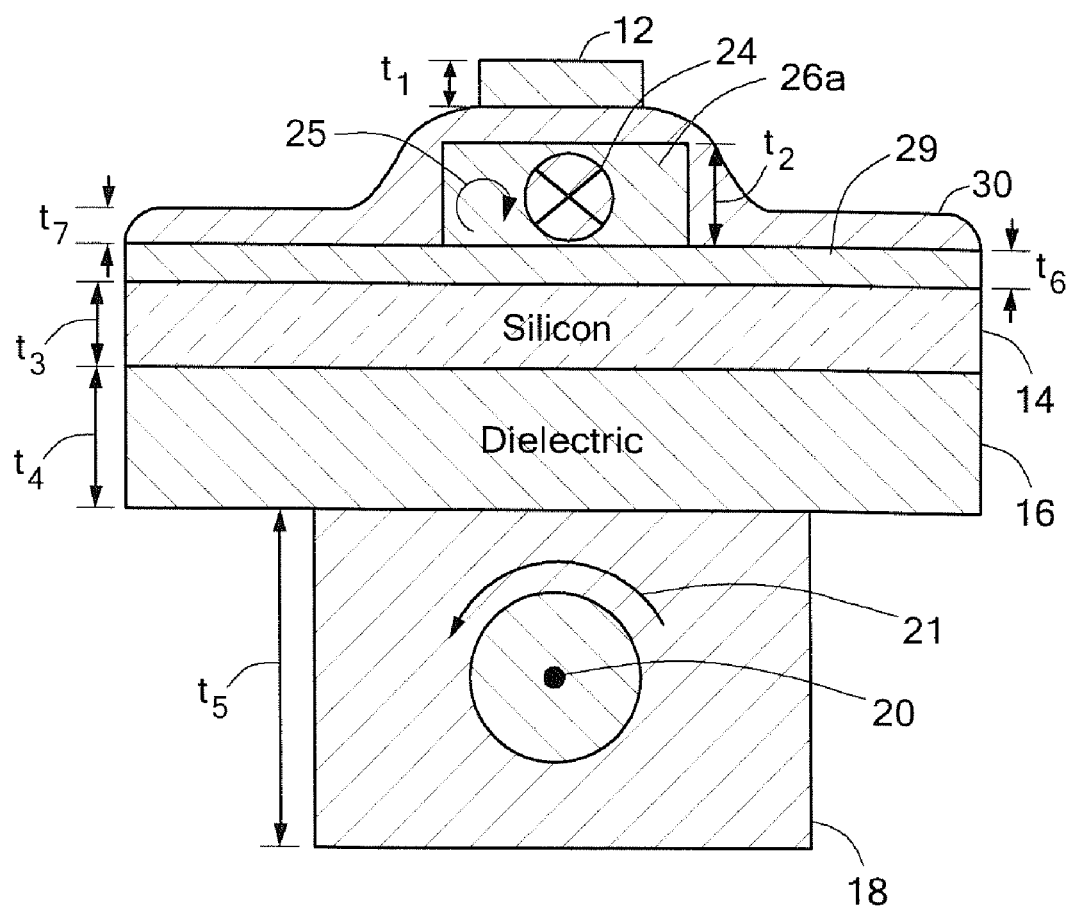
FIG. 2 is a cross-sectional view of the closed loop current sensor of FIG. 1 taken along line 2-2 of FIG. 1.

Referring now to FIG. 2, a cross-section of the circuit 10 taken along line 2-2 of FIG. 1 shows the primary conductor 18 through which the primary current 20 flows as a conventional arrowhead symbol to indicate the primary current 20 flowing in a direction out of the page. The primary magnetic field 21 is generated in response to the primary current 20 in a direction governed by known electromagnetic properties of electrical current. The dielectric 16 isolates the primary conductor 18 from the silicon substrate 14. A first insulating layer 29 is disposed on the silicon substrate 14. The first insulating layer 29 can include, but is not limited to, a silicon dioxide layer, a nitride layer, or a polyimide passivation layer.

The secondary conductor portion 26a is disposed over the first insulating layer 29, for example in the form of a metalized trace. The secondary current 24, shown as a conventional arrow tail symbol to indicate the secondary current 24 flowing in a direction into the page, passes through the secondary conductor portion 26a. The secondary magnetic field 25 is generated in response to the secondary current 24, in a direction opposite to the primary magnetic field 21. A second insulating layer 30 is disposed over the secondary conductor portion 26a. The magnetic field transducer 12 is disposed proximate to the secondary conductor portion 26a, on top of the second insulating layer 30

In one particular embodiment, a thickness t1 of the magnetic field transducer 12 is on the order of 30 to 300 Angstroms, a thickness t2 of the secondary conductor portion 26a is on the order of 2.5 micrometers, a thickness t3 of the silicon substrate 14 is on the order of 280 micrometers, a thickness t4 of the dielectric layer 16 is on the order of 100 micrometers, a thickness t5 of the primary conductor 18 is on the order of 200 micrometers, a thickness t6 of the first insulating layer 29 is on the order of one micrometer, and a thickness t7 of the second insulating layer 30 is on the order of one micrometer. However, other thicknesses can be used. The thicknesses t1, t2, t3, t3, t4, t5, t6, t7 are selected in accordance with a variety of factors. For example, the thickness t3 of the silicon substrate 14 can be selected in accordance with a nominal thickness of a conventional silicon wafer. For another example, the thickness t4 of the dielectric layer 16 can be selected to provide a desired separation between the primary conductor 18 and the secondary conductor portion 26a, and therefore, a desired relationship between the primary current 20 and the secondary current 24 (i.e., to provide a desired sensitivity). For yet another example, the thickness t6, t7 of the first and second insulating layers 29, 30, and also thickness of the primary conductor 18 and the secondary conductor portion 26a can be selected in accordance with insulating layers and deposited conductors used in conventional integrated circuit manufacture.

In another particular embodiment, the primary conductor 18 is a circuit board conductor or trace. With this particular arrangement, the primary conductor 18 is formed by conventional circuit board etching processes, and the dielectric 16 having the silicon substrate 14 disposed thereon is placed on the circuit board (not shown) on top of, or otherwise proximate, the primary conductor 18.

In one particular embodiment, the first and/or the second insulating layers 29, 30 are planarized prior to fabrication of the magnetic field transducer 12, in order to provide a consistent and flat surface upon which the magnetic field transducer 12 is disposed. The planarizing can be provided as a chemical mechanical polish (CMP).

In an alternative embodiment, the magnetic field transducer 12 can be disposed between the secondary conductor portion 26a and the silicon substrate 14. In this case, the secondary current 24 is in a direction coming out of the page. The secondary conductor portion 26a can be a wire or the like mounted on top of the magnetic field transducer 12, or a conductor trace deposited on the magnetic field transducer 12.

Figure 3:
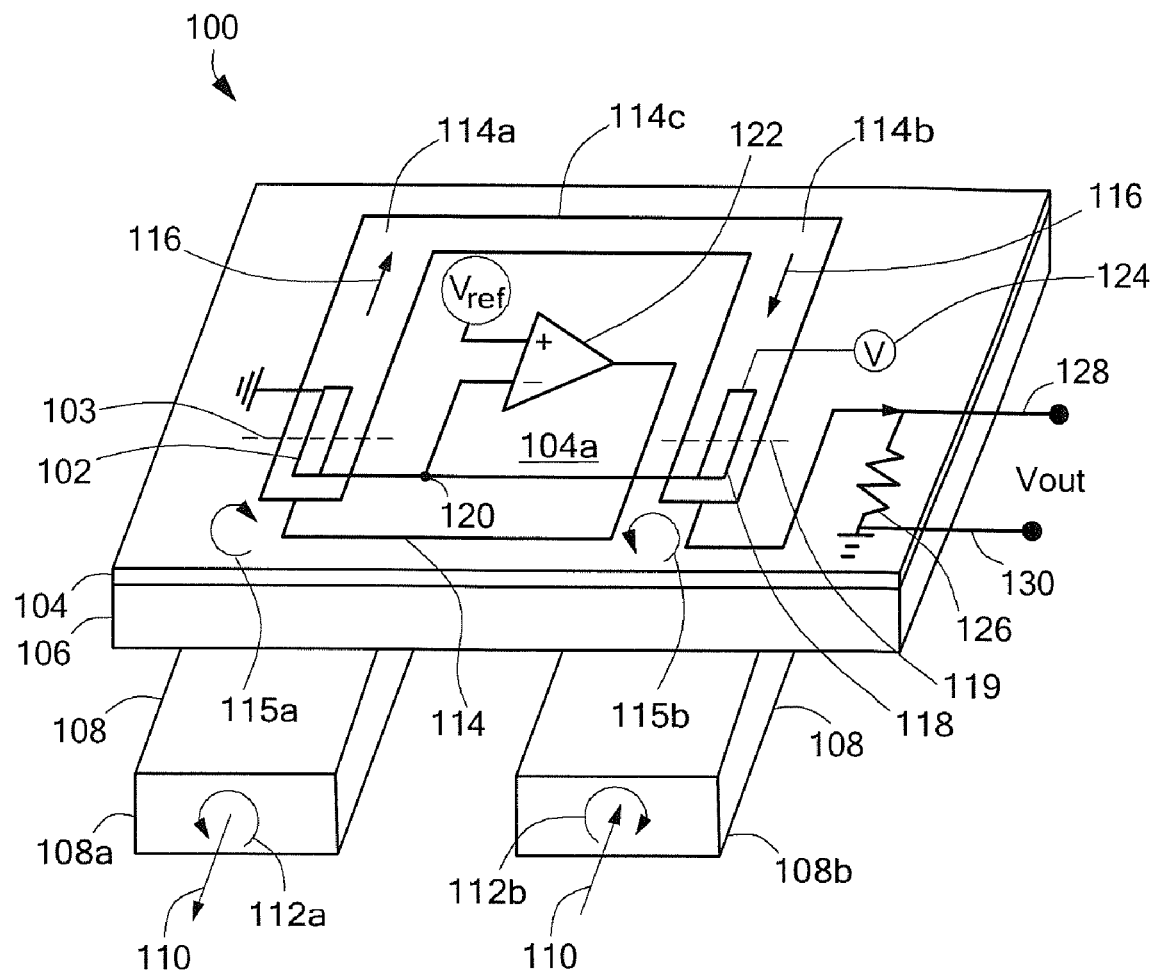
FIG. 3 is an isometric view of an alternate embodiment of a closed loop current sensor in accordance with the present invention.

Referring now to FIG. 3, an electronic circuit 100 in the form of a closed loop current sensor is shown. The current sensor 100 differs from the current sensor 10 of FIG. 1 in that it contains two magnetic field transducers 102, 118 arranged to reduce susceptibility to stray magnetic fields, temperature effects, and manufacturing variations, as will be described. The circuit 100 includes a silicon substrate 104, first and second magnetic field transducers 102, 118 respectively disposed over a surface 104a of the silicon substrate, and a conductor 114 disposed over the surface 104a of the silicon substrate 104 proximate to the first and second magnetic field transducers 102, 118. A further, primary, conductor 108 is isolated from the silicon substrate 104 by a dielectric 106, as shown. The primary conductor 108 has a first primary conductor portion 108a and a second primary conductor portion 108b that together from a continuous primary conductor 108. Similarly, the secondary conductor 114 has first and second secondary conductor portions 114a, 114b, respectively coupled together by an intermediate conductor portion 114c in order to form a continuous conductor. In the illustrative embodiment, the primary and secondary conductors 108, 114 are substantially u-shaped.

Unless otherwise noted, components of FIG. 3 have the same structure, functions, and characteristics as like components in preceding figures. For example, magnetic field transducers 102, 118 are shown here as magnetoresistance elements such as giant magnetoresistance (GMR) elements 102, 118.

In operation, a primary current 110 flows through the first primary conductor portion 108a, thereby generating a first primary magnetic field 112a and a secondary current 116 flows through the first secondary conductor portion 114a, thereby generating a first secondary magnetic field 115a. Because the secondary current 116 passes through the secondary conductor portion 114a in a direction opposite to the primary current 110 passing through the primary conductor portion 108a, the first secondary magnetic field 115a is opposite in direction to the first primary magnetic field 112a. For similar reasons, a second secondary magnetic field 115b is opposite in direction to a second primary magnetic field 112b.

A voltage source 124 here integrated in the silicon substrate 104 provides a current through the first and second magnetic field transducers 102, 118 and therefore, generates a voltage at node 120 having a magnitude related to the magnetic field experienced by the magnetic field transducers 102, 118. An amplifier 122, coupled to the magnetic field transducers 102, 118, provides the secondary current 116 to the secondary conductor 114 in response to the voltage at the node 120.

The first magnetic field transducer 102 has a response axis 103 and the second magnetic field transducer 118 has a response axis 119. The first and second magnetic field transducers 102, 118 are responsive to magnetic fields at particular angles to the response axes 103, 119 respectively as described for the response axis 13 in conjunction with FIG. 1.

The magnetic field transducers 102, 118 are polarized in the same direction. Since secondary current 116 passes by the first and second magnetic field transducers 102, 118 in opposite directions, the first and second secondary magnetic fields 115a, 115b, have opposite directions. The second magnetic field transducer 118 is at a higher voltage side of a resistor divider formed by the first and second magnetic field transducers 102, 118. Therefore, when exposed to the first and the second secondary magnetic fields 115a, 115b that are in opposite directions, the resistances of the first and second magnetic field transducers 102, 118 change in opposite directions, and the voltage at node 120 changes accordingly.

In the particular arrangement shown, the node 120 is coupled to the negative input of the amplifier 122, and the resistance of the first magnetic field transducer 102 tends to decrease while the resistance of the second magnetic field transducer tends to increase in response to the first and second primary magnetic fields 112a, 112b. However, as described above, the first and second secondary magnetic fields 115a, 115b tend to oppose the first and second primary magnetic fields 112a, 112b.

With this arrangement, a reduction in the sensitivity of the electronic circuit 100 to external magnetic fields is achieved. This is because an external magnetic field would cause the resistance of the two magnetic field transducers 102, 118 to change in the same direction, therefore generating no voltage change at the node 120.

The first magnetic field transducer 102 is oriented on the silicon substrate 104 such that the response axis 103 is aligned with both the first primary magnetic field 112a and the first secondary magnetic field 115a. The magnetic field experienced by the first magnetic field transducer 102 is the sum of the first secondary magnetic field 115a and first primary magnetic field 112a along the response axis 103. Similarly, the magnetic field experienced by the second magnetic field transducer 118 is the sum of the second secondary magnetic field 115b and second primary magnetic field 112b along the response axis 119. Since the first secondary magnetic field 115a is opposite in direction to the first primary magnetic field 112a along the response axis 103, the first secondary magnetic field 115a tends to cancel the first primary magnetic field 112a. For similar reasons, the second secondary magnetic field 115b tends to cancel the second primary magnetic field 112b.

The amplifier 122 generates the secondary current 116 in proportion to the voltage at node 120 and therefore, the amplifier 122 provides the secondary current 116 at a level necessary to generate the first and second secondary magnetic fields 115a, 115b sufficient to cancel the first and second primary magnetic fields 112a, 112b respectively along the response axes 103, 119, so that the total magnetic field experienced by each of the magnetic field transducers 102, 118 is substantially zero gauss.

The secondary current 116 passes through a resistor 126, thereby generating an output voltage, Vout, between output terminals 128, 130 in proportion to the secondary current 116. With this arrangement, the output voltage, Vout, is proportional to each of the first and second secondary magnetic fields 115a, 115b and is thus, proportional to the primary current 110, as desired.

In an alternate arrangement, the first and the second magnetic field transducers 102, 118 are polarized in opposite directions. Accordingly, the primary conductor 108 and the secondary conductor 114 provide a primary current and a secondary current (not shown) that pass by the magnetic field transducers 102, 118 each in but one direction, yet each is opposite in direction to the other. Thus, in this alternate arrangement, the first and second secondary magnetic fields 115a, 115b are in the same direction and both opposite to the first and second primary magnetic fields 112a, 112b, respectively. It will be recognized by one of ordinary skill in the art that other polarity combinations are possible, for example, by coupling the node 120 to an input to the amplifier 122 having the opposite input polarity to that shown, so long as each such alternate arrangement results in opposition of the first and second secondary magnetic fields 115a, 115b with the first and second primary magnetic fields 112a, 112b respectively.

The closed loop current sensor 100, having the two magnetic field transducers 102, 118, experiences smaller device-to-device sensitivity errors than the closed loop current sensor 10 of FIG. 1 as a result of the resistor divider arrangement of the two magnetic field transducers 102, 118. This is because manufacturing process variations will affect both magnetic field transducers in the same way. Thus, the voltage at resistor divider node 120 is substantially unaffected by manufacturing process variations. Where the magnetic field transducers 102, 118 are made in the same manufacturing sequence, the voltage at resistor divider node 120 is substantially unaffected also by temperature changes.

Figure 4:
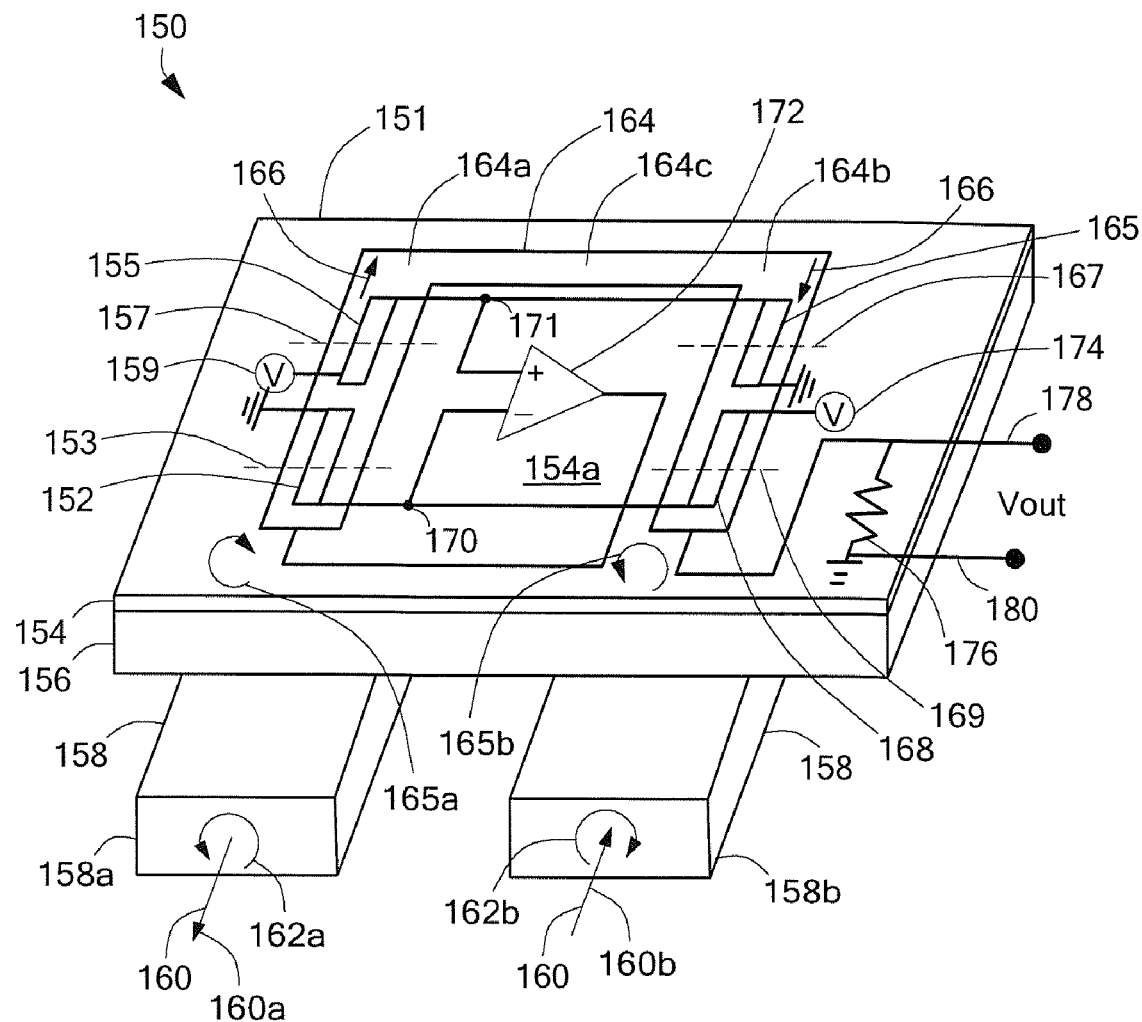
FIG. 4 is an isometric view of another alternate embodiment of a closed loop current sensor in accordance with the present invention.

Referring now to FIG. 4, an electronic circuit 150 in the form of a closed loop current sensor is shown. The current sensor 150 differs from the current sensor 10 of FIG. 1 in that it contains four magnetic field transducers 152, 155, 165 and 168 arranged to further reduce errors, as will be described. The magnetic field transducers 152, 168, 155, 165 are disposed over a surface 154a of a silicon substrate 154. A conductor 164 is also disposed over the surface 154a of the silicon substrate 154 proximate to the magnetic field transducers 152, 168, 155, 165. A further, primary, conductor 158 is isolated from the silicon substrate 154 by a dielectric 156, as shown. The primary conductor 158 has a first primary conductor portion 158a and a second primary conductor portion 158b that together form a continuous primary conductor 158 through which a primary current 160 flows. Similarly, the secondary conductor 164 has first and second secondary conductor portions 164a, 164b.

Unless otherwise noted, components of FIG. 4 have the same structure, features, and characteristics as like components in preceding figures. For example, magnetic field transducers 152, 168, 155, 165 are shown here as magnetoresistance elements, such as giant magnetoresistance (GMR) elements.

In operation, a primary current 160 flows through the primary conductor 158, thereby generating a first primary magnetic field 162a and a second primary magnetic field 162b. A secondary current 166 flows through the second secondary conductor 164, thereby generating a first secondary field 165a at the conductor portion 164a and a second secondary magnetic field 165b at conductor portion 164b. Because the secondary current 166 passes through the first secondary conductor portion 164a in a direction opposite to the primary current 160 passing through the first primary conductor portion 158a, the first secondary magnetic field 165a is opposite in direction to the first primary magnetic field 162a. For similar reasons, the second secondary magnetic field 165b is opposite in direction to the second primary magnetic field 162b.

A first voltage source 174, here integrated in the silicon substrate 154, provides a current through the first and second magnetic field transducers 152, 168 and, therefore, generates a voltage at node 170 having a magnitude related to the magnetic field experienced by the first and second magnetic field transducers 152, 168. Similarly, a second voltage source 159, also here integrated in the silicon substrate 154, provides a current through the third and fourth magnetic field transducers 155, 165 and, therefore, generates a voltage at node 171 having a magnitude related to the magnetic field experienced by the third and fourth magnetic field transducers 155, 165. In one particular embodiment, the first and the second voltage sources 174, 159 supply the same voltage and are provided by a single voltage source. An amplifier 172, coupled to the magnetic field transducers 152, 168, 155, 165, provides the secondary current 166 to the secondary conductor 164 in response to the voltage difference between the nodes 170 and 171.

The first magnetic field transducer 152 has a response axis 153, the second magnetic field transducer 168 has a response axis 169, the third magnetic field transducer 155 has a response axis 157, and the fourth magnetic field transducer 165 has a response axis 167. The magnetic field transducers 152, 168, 155, 165, are responsive to magnetic fields at particular angles to the response axes 153, 169, 157, 167 as described for the response axis 13 in conjunction with FIG. 1.

The magnetic field transducers 152, 168, 155, 165 are all polarized in the same direction. Since secondary current 166 passes by the first and third magnetic field transducers 152, 155 in an opposite direction from the secondary current 166 passing by the second and fourth magnetic field transducers 168, 165, the first and second secondary magnetic fields 165a, 165b have opposite directions. The second magnetic field transducer 168 is at a higher voltage side of a first resistor divider formed by the first and second magnetic field transducers 152, 168, and the third magnetic field transducer 155 is at a higher voltage side of a second resistor divider formed by the third and fourth magnetic field transducers 155, 165.

Therefore, when exposed to the first and the second secondary magnetic fields 165a, 165b, the voltage at node 170 moves in one direction and the voltage at the node 171 moves in the other direction.

In the particular arrangement shown, the node 170 is coupled to a negative input of the amplifier 172 and the node 171 is coupled to a positive input of the amplifier 172. The voltage at the node 171 tends to increase while the voltage at the node 170 tends to decrease in response to the first and second primary magnetic fields 162a, 162b. However, as described above, the first and second secondary magnetic fields 165a, 165b tend to oppose the first and second primary magnetic fields 112a, 112b.

The first and third magnetic field transducers 152, 155 are oriented such that the response axes 153, 157 are aligned with the first primary magnetic field 162a and with the first secondary magnetic field 165a. The magnetic field experienced by the first magnetic field transducer 152 and the third magnetic field transducer 155 is the sum of the first secondary magnetic field 165a and the first primary magnetic field 162a along the respective response axes 153, 157. Similarly, the magnetic field experienced by the second magnetic field transducer 168 and the fourth magnetic field transducer 165 is the sum of the second secondary magnetic field 165b and the second primary magnetic field 162b along the respective response axes 169, 167. Since the first secondary magnetic field 165a is opposite in direction to the first primary magnetic field 162a along the response axes 153, 157, the first secondary magnetic field 165a tends to cancel the first primary magnetic field 162a. Similarly, since the second secondary magnetic field 165b is opposite in direction to the second primary magnetic field 162b along the response axes 167, 169, the second secondary magnetic field 165b tends to cancel the second primary magnetic field 162b. The amplifier 172 generates the secondary current 166 in proportion to the voltage difference between nodes 170 and 171.

The amplifier 172 provides the secondary current 166 at a level necessary to generate the first and second secondary magnetic fields 165a, 165b sufficient to cancel the first and second primary magnetic fields 162a, 162b along the response axes 153, 169, 157, 167 so that the total magnetic field experienced by each of the magnetic field transducers 152, 168, 155, 165 is substantially zero gauss.

The secondary current 166 passes through a resistor 176, thereby generating an output voltage, Vout, between output terminals 178, 180 in proportion to the secondary current 166. With this arrangement, the output voltage, Vout, is proportional to each of the first and the second secondary magnetic fields 165a, 165b and is thus, proportional to the primary current 160, as desired.

In an alternate arrangement, the first and the fourth magnetic field transducers 152, 165 are polarized in an opposite direction from the second and third magnetic field transducers 168, 155. Accordingly, in one such alternate arrangement, the primary conductor 158 and the secondary conductor 164 provide current in but one direction, each opposite to each other. Therefore, the first and second secondary magnetic fields 165a, 165b are in the same direction and both opposite to the first and second primary magnetic fields 162a, 162b respectively. In another such alternate arrangement in which the first and the fourth magnetic field transducers 152, 165 are polarized in an opposite direction from the second and third magnetic field transducers 168, 155, the first and second voltage sources are coupled instead to the same side of each pair. That is, the second voltage source 159 is instead directly coupled to the fourth magnetic field transducer 165 or the first voltage source 174 is instead directly coupled to the first magnetic field transducer 152.

The closed loop current sensor 150, having the four magnetic field transducers 152, 168, 155, 165, provides smaller device-to-device sensitivity errors than the closed loop current sensor 10 of FIG. 1 and the closed loop current sensor 100 of FIG. 2 as a result of two factors. First, the magnetic field transducers 152, 168, and the magnetic field transducers 155, 165 from two respective resistor dividers. For reasons described above in conjunction with FIG. 2, a resistor divider arrangement provides reduced sensitivity errors in view of manufacturing process variations and also reduced susceptibility to external magnetic fields. Second, the four magnetic field transducers are coupled in a Wheatstone bridge arrangement, which provides a differential output with reduced sensitivity to common mode effects. For example, if a voltage spike occurs in the voltage sources 159, 174, thereby changing common mode voltage at both of the nodes 170 and 171, the voltage difference between the nodes 170 and 171 is unaffected.

In alternate arrangements, similar benefits to those of the Wheatstone bridge arrangement can be achieved if two of the magnetic field transducers have no response to magnetic fields. For example, in one particular alternate arrangement, the third and fourth magnetic field transducers 155, 165 are magnetically non-responsive, either by application of magnetic shielding or by manufacturing those magnetic field transducers 155, 165 to have no response to magnetic fields. In these alternate arrangements, the alternate Wheatstone bridge arrangements reject common mode signals as described above.

It will be appreciated by those of ordinary skill in the art that while the closed loop current sensor 150 has four magnetic field transducers 152, 168, 155, 165, alternative closed loop current sensors can be provided with more than four magnetic field transducers. Also, in another alternate arrangement, the first and the second voltage sources 174, 159 can be replaced with current sources.

Figure 5:
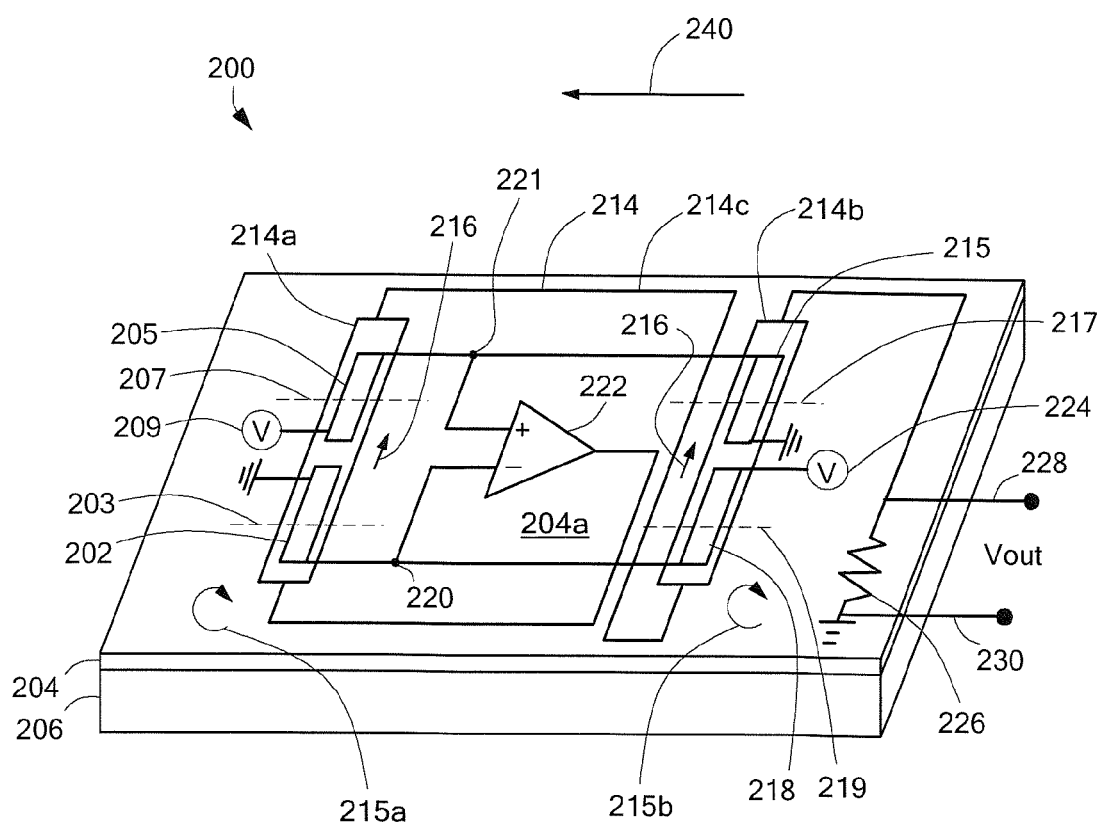
FIG. 5 is an isometric view of a closed loop magnetic field sensor in accordance with the present invention.

Referring now to FIG. 5, an electronic circuit in the from of a magnetic field sensor 200 includes a silicon substrate 204, first, second, third, and fourth magnetic field transducers 202, 218, 205, 215, respectively disposed over a surface 204a of the silicon substrate 204, and a conductor 214 disposed over the surface 204a of the silicon substrate 204 proximate to the magnetic field transducers.

The magnetic field sensor 200 is adapted to sense an external magnetic field 240 and to provide an output signal, Vout, proportional to the magnetic field 240. Unless otherwise noted, components of FIG. 5 have the same structure, features, and characteristics as like components in preceding figures. For example, the first, second, third, and fourth magnetic field transducers 202, 218, 205, 215 are shown here as magnetoresistance elements, such as giant magnetoresistance (GMR) elements.

In operation, a current 216 flows through a first portion 214a of conductor 214 and through a second portion 214b of conductor 214, thereby generating a first magnetic field 215a and a second magnetic field 215b. The first and second magnetic fields 215a, 215b, respectively are in the same direction as each other, but are in the opposite direction with respect to the external magnetic field 240. Thus, the first magnetic field 215a and the second magnetic field 215b tend to cancel the external magnetic field 240.

A first voltage source 224, here integrated in the silicon substrate 204, provides a current through the first and second magnetic field transducers 202, 218 and therefore, generates a voltage at node 220 having a magnitude related to the magnetic field experienced by the first and second magnetic field transducers 202, 218. Similarly, a second voltage source 209, also here integrated in the silicon substrate 204, provides a current through the third and fourth magnetic field transducers 205, 215 and therefore, generates a voltage at node 221 having a magnitude related to the magnetic field experienced by the third and fourth magnetic field transducers 205, 215. In one embodiment, the first and the second voltage sources 224, 209 supply the same voltage and are provided by a single voltage source. An amplifier 221, coupled to the magnetic field transducers 202, 218, 205, 215, provides the secondary current 216 to the secondary conductor 214 in response to the voltage difference between the nodes 220 and 221.

The first magnetic field transducer 202 has a response axis 203, the second magnetic field transducer 218 has a response axis 219, the third magnetic field transducer 205 has a response axis 207, and the fourth magnetic field transducer 215 has a response axis 217. The magnetic field transducers 202, 218, 205, 215, are responsive to magnetic fields at particular angles to the response axes 203, 219, 207, 217 as described for the response axis 13 in conjunction with FIG. 1.

The first and fourth magnetic field transducers 202, 215 are polarized in an opposite direction from the second and third magnetic field transducers 218, 205. Therefore, the advantages described above that would otherwise be provided by having all of the magnetic field transducers polarized in the same direction are not achieved with the electronic circuit 200. One such advantage stated above was a reduced sensitivity to external magnetic fields. Here instead, the electronic circuit is responsive to the external magnetic field 240. The current 216 passes by the first, second, third, and fourth magnetic field transducers 202, 218, 205, 215, in the same direction, therefore generating the first and second magnetic fields 215a, 215b in the same direction. Therefore, due to opposing polarities among the magnetic field transducers 202, 218, 205, 215, when exposed to the first and second magnetic fields 215a, 215b that are in the same direction, the voltage at the node 220 moves in one voltage direction and the voltage at the node 221 moves in the other voltage direction.

In the particular arrangement shown, the node 220 is coupled to a negative input of the amplifier 222 and the node 221 is coupled to a positive input of the amplifier 222. The voltage at the node 221 tends to increase while the voltage at the node 220 tends to decrease in response to the external magnetic field 240. However, as described above, the first and second secondary magnetic fields 215a, 215b tend to oppose the first and second primary magnetic fields 112a, 112b.

The first, second, third, and fourth magnetic field transducers 202, 218, 205, 215 are oriented such that the response axes 203, 219, 207, 217 are aligned with the external magnetic field 240 and also with the first and second secondary magnetic fields 215a, 215b. The magnetic field experienced by the first and third magnetic field transducers 202, 205 is the sum of the first secondary magnetic field 215a and the external magnetic field 240 along the response axes 203, 207 respectively. Similarly, the magnetic field experienced by the second and fourth magnetic field transducers 218, 215 is the sum of the second secondary magnetic field 215b and the external magnetic field 240 along the response axes 219, 217 respectively. Since the first and second magnetic fields 215a, 215b are opposite in direction to the external magnetic field 240 along the response axes 203, 219, 207, 217, the first and second magnetic fields 215a, 215b tend to cancel the external magnetic field 240. The amplifier 221 generates the current 216 in proportion to the voltage difference between the node 220 and the node 221. Thus, the amplifier 222 provides the current 216 at a level necessary to generate the first and second magnetic fields 215a, 215b sufficient to cancel the external magnetic field 240 along the response axes 203, 219, 207, 217 so that the total magnetic field experienced by each of the magnetic field transducers 202, 218, 205, 215 is substantially zero gauss.

The current 216 passes through a resistor 226 thereby generating an output voltage, Vout, between output terminals 228, 230 in proportion to the current 216. With this arrangement, the output voltage, Vout, is proportional to each of the first and the second magnetic fields 215a, 215b necessary to cancel the external magnetic field 240, and is thus proportional to the external magnetic field, as desired.

The four magnetic field transducers 202, 218, 205, 215 arranged as shown provide a Wheatstone bridge arrangement. For reasons described above in conjunction with FIG. 4, the Wheatstone bridge arrangement provides reduced sensitivity errors in view of manufacturing process variations and also improved rejection of common mode effects.

It should be recognized that while the closed loop magnetic field sensor 200 is shown having four magnetic field transducers 202, 218, 205, 215, in an alternate arrangement, a closed loop magnetic field sensor can have more than four or fewer than four magnetic field transducers. Also, in another alternate arrangement, the first and the second voltage sources 224, 209 can be replaced with current sources. In other alternative arrangements, two of the magnetic field transducers have no response to a magnetic field as described in conjunction with FIG. 4.

Figure 5A:
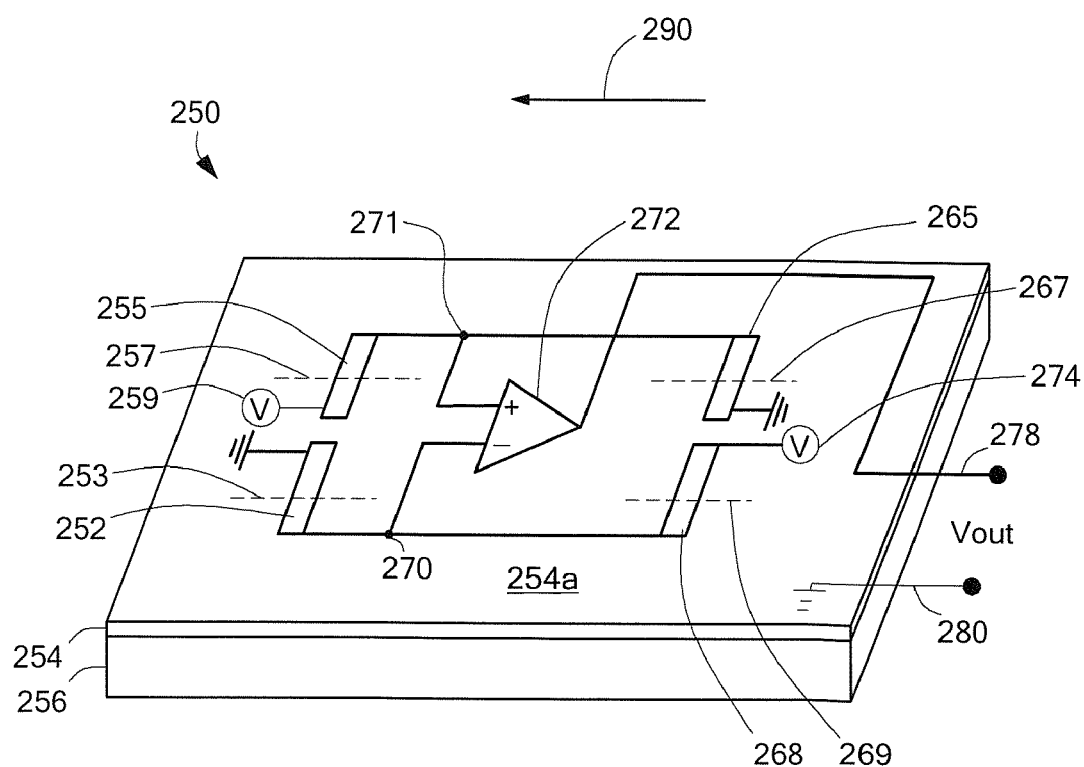
FIG. 5A is an isometric view of an open loop magnetic field sensor in accordance with the present invention.

Referring now to FIG. 5A, an electronic circuit 250 in the form of an open loop magnetic field sensor 250 responsive to an external magnetic field 290 is shown. The sensor 250 includes a silicon substrate 254, and first, second, third, and fourth magnetic field transducers 252, 268, 255, 265 disposed over a surface 254a of the silicon substrate 254. Unless otherwise noted, components of FIG. 5A have the same structure, features, and characteristics as like components in preceding figures. For example, the magnetic field transducers 252, 268, 255, 265 are shown here as magnetoresistance elements such as giant magnetoresistance (GMR) elements.

In operation, the magnetic field transducers 252, 268, 255, 265 are responsive to an external magnetic field 290. A first voltage source 274, here integrated in the silicon substrate 254, provides a current through the first and second magnetic field transducers 252, 268 and therefore, generates a voltage at a node 270 having a magnitude related to the magnetic field experienced by the transducers 252, 268. Similarly, a second voltage source 259, also here integrated in the silicon substrate 254, provides a current through the third and fourth magnetic field transducers 255, 265 and therefore, generates a voltage at a node 271 having a magnitude related to the magnetic field experienced by the transducers 255, 265. In one particular embodiment, the first and the second voltage sources 274, 259 supply the same voltage and are provided by a single voltage source. An amplifier 272, coupled to the magnetic field transducers 252, 268, 255, 265, provides an output signal, Vout, between the output terminals 278, 280 in response to the voltage difference between nodes 270 and 271.

The first magnetic field transducer 252 has a response axis 253, the second magnetic field transducer 268 has a response axis 269, the third magnetic field transducer 255 has a response axis 257, and the fourth magnetic field transducer 265 has a response axis 267. The magnetic field transducers 252, 268, 255, 265, are responsive to magnetic fields at particular angles to the response axes 253, 269, 257, 267 as described for the response axis 13 in conjunction with FIG. 1. The first, second, third, and fourth magnetic field transducers 252, 268, 255, 265 are oriented such that the response axes 253, 269, 257, 267 are aligned with the external magnetic field 290, as shown.

The first and fourth magnetic field transducers 252, 265 are polarized in the same direction as each other, but in an opposite direction from the second and third magnetic field transducers 268, 255. Since the external magnetic field 290 passes by the first, second, third, and fourth magnetic field transducers 252, 268, 255, 265 in the same direction, the first and fourth magnetic field transducers 202, 215 respond in an opposite direction from the second and third magnetic field transducers 218, 205 so as to provide a voltage change at the node 170 in a direction opposite from the voltage change at the node 171.

It should be recognized that while the open loop magnetic field sensor 250 is shown having four magnetic field transducers 252, 268, 255, 265, in an alternate arrangement, an open loop magnetic field sensor can have more than four or fewer than four magnetic field transducers. Also, in another alternate arrangement, the first and the second voltage sources 274, 259 can be replaced with current sources. In other alternate arrangements, two of the magnetic field transducers have no response to a magnetic field as described in conjunction with FIG.4.

Figure 6:
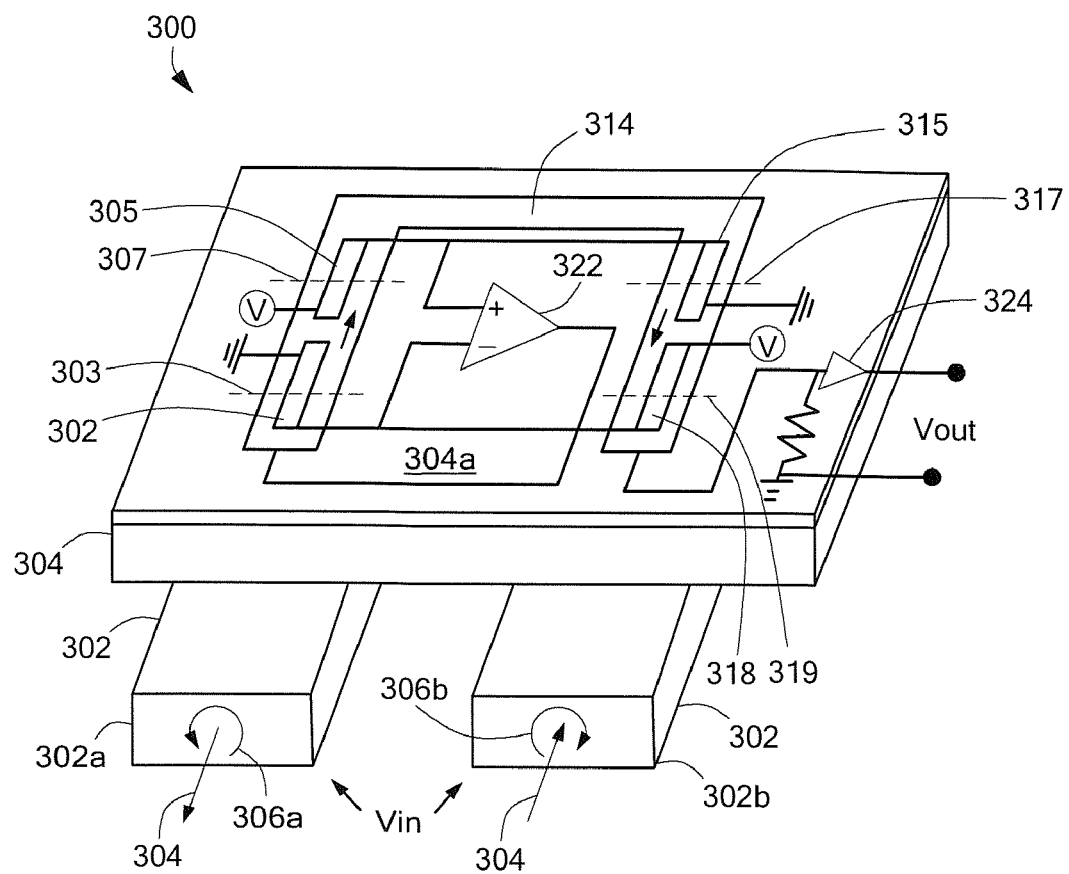
FIG. 6 is an isometric view of a closed loop signal isolator in accordance with the present invention.
Figure 7:
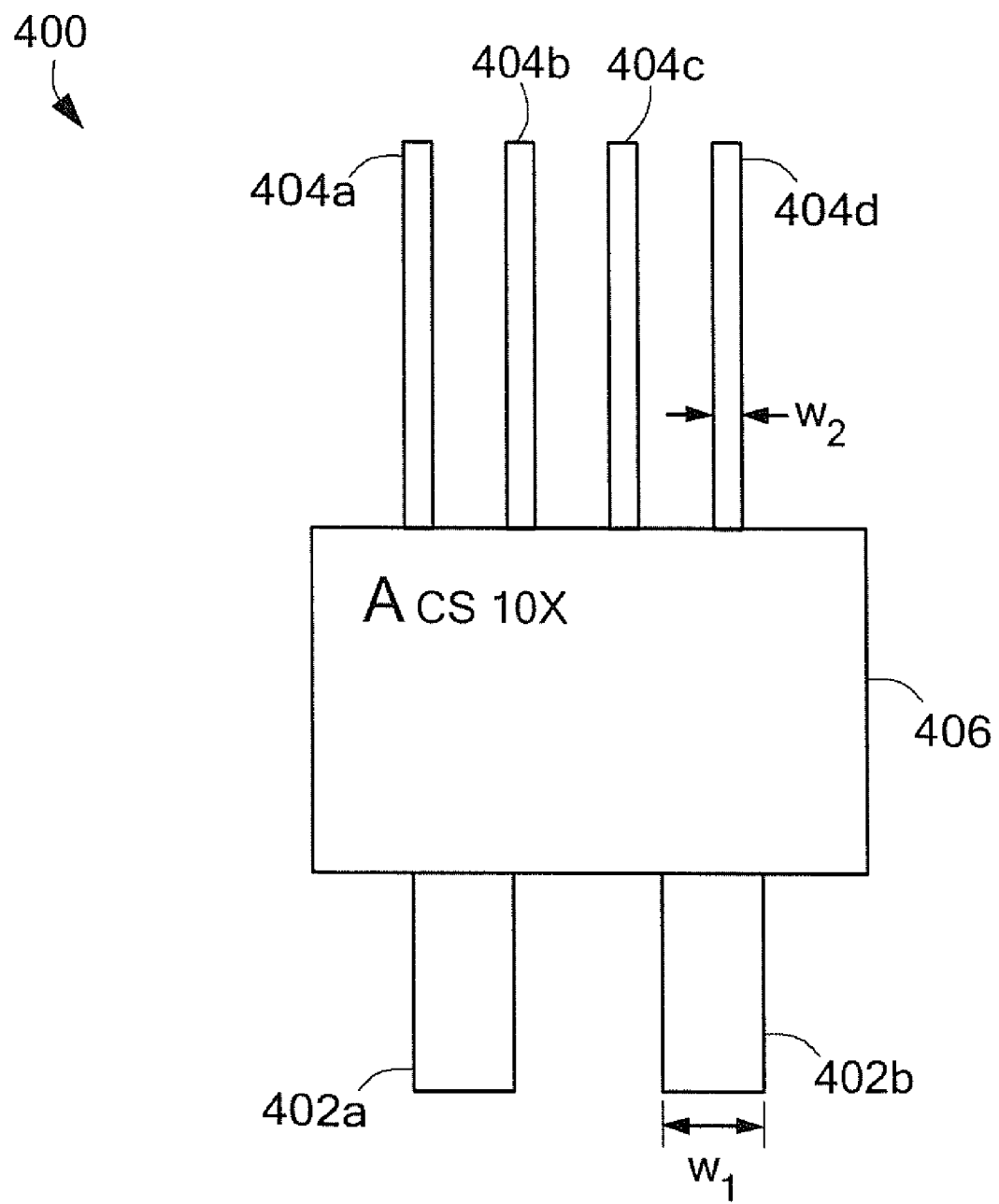
FIG. 7 is a plan view of an of exemplary packaged integrated sensor.

Referring now to FIG. 6, an electronic circuit 300 in the from of a signal isolator is shown. The closed loop electronic isolator 300 includes a first, second, third, and fourth magnetic field transducer 302, 318, 305, 315 respectively, disposed over the surface 304a of a silicon substrate 304, and a conductor 314 disposed over the surface 354a of the silicon substrate 354 proximate to the magnetic field transducers.

The electronic circuit 300 operates substantially in the same way as the electronic circuit 150 of FIG. 4, except that the electronic circuit 300 is responsive to an input voltage, Vin. A primary conductor 302, unlike the primary conductor 158 of FIG. 4, has substantial resistance, either as distributed resistance or lumped resistance in the form of a resistor (not shown). Application of an input voltage, Vin, to conductor 302, across conductor portions 302a and 302b, generates a primary current 304.

In operation, the input voltage, Vin, generates the primary current 304 that flows through the primary conductor 302, thereby generating a first primary magnetic field 306a and a second primary magnetic field 306b. The first primary magnetic field 306a and the second primary magnetic field 306b are substantially cancelled by secondary magnetic fields generated by the secondary current provided by the amplifier 322, as described in connection with FIG. 4. A comparator 324 provides a digital output signal, Vout, in a logic state dependent on whether the sensed input voltage, Vin, is greater or less than a predetermined threshold voltage. With this arrangement, the closed loop electronic isolator 300 generates an output voltage signal, Vout, indicative of the level of the input voltage, Vin, which output voltage signal is electrically isolated from the input voltage, Vin.

Figure 6A:
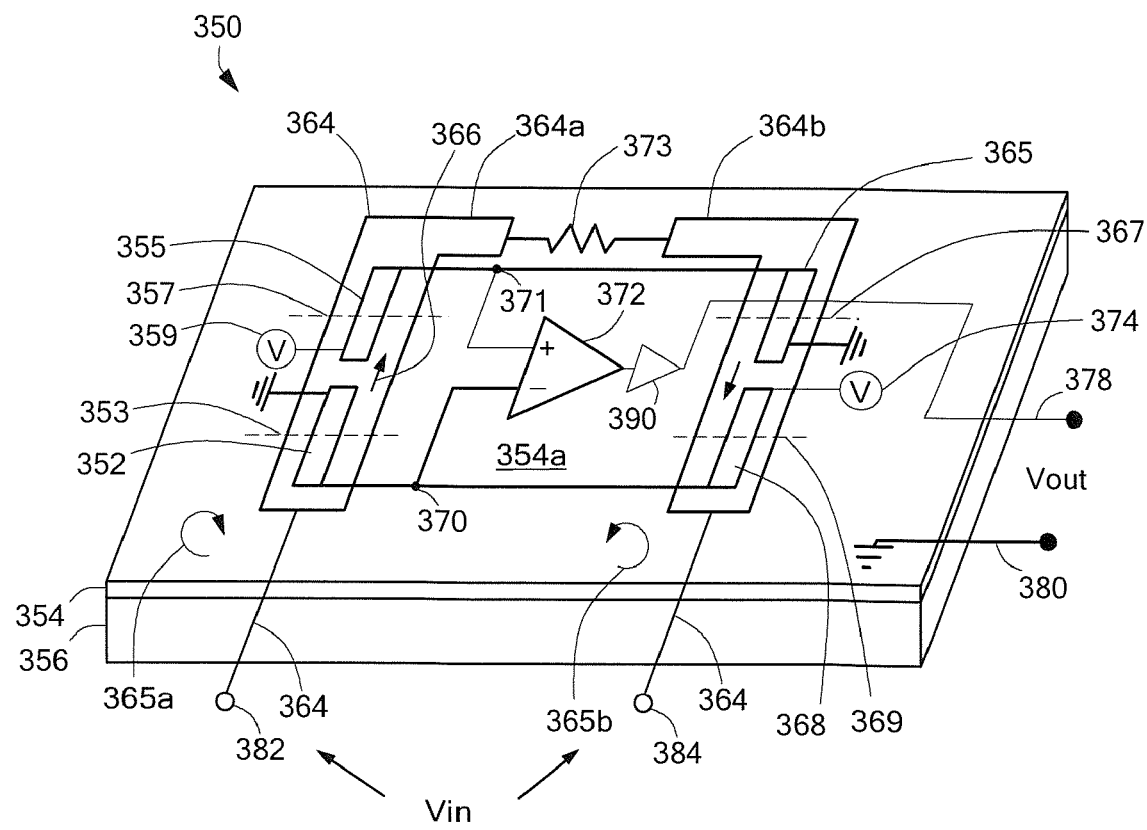
FIG. 6A is an isometric view of an open loop signal isolator in accordance with the present invention.

Referring now to FIG. 6A, an open loop signal isolator 350 includes a first, second, third, and fourth magnetic field transducer 352, 368, 355, 365 respectively, disposed over a surface 354a of a silicon substrate 354, and a conductor 364 disposed over the surface 354a of the silicon substrate 354 proximate to the magnetic field transducers. Unless otherwise noted, like components of FIG. 6A have the same structure, features, and characteristics as like components in preceding figures. The magnetic field transducers 352, 368, 355, 365 are shown here as magnetoresistance elements, such as giant magnetoresistance (GMR) elements.

In operation, current 366 flows through a first portion 364a of conductor 364 and through a second portion 364b of conductor 364, thereby generating a first magnetic field 365a and a second magnetic field 365b. Because the current 366 passing through the first conductor portion 364a is opposite in direction to the current 366 passing through the second conductor portion 364b, the first magnetic field 365a is opposite in direction to the second magnetic field 365b.

A first voltage source 374, here integrated in the silicon substrate 354, provides a current through the first and second magnetic field transducers 352, 368 and, therefore, generates a voltage at node 370 having a magnitude related to the magnetic field experienced by the first and second magnetic field transducers 352, 368. Similarly, a second voltage source 359, also here integrated in the silicon substrate 354, provides a current through the third and fourth magnetic field transducers 355, 365 and therefore, generates a voltage at node 371 having a magnitude related to the magnetic field experienced by the third and fourth magnetic field transducers 355, 365. In one embodiment, the first and the second voltage sources 374, 359 supply the same voltage and are provided by a single voltage source. An amplifier 372, coupled to the magnetic field transducers 352, 368, 355, 365, provides a voltage output to a comparator 390, which provides a digital voltage, Vout, between output terminals 378, 380 in response to the voltage difference between the nodes 170 and 171.

The first magnetic field transducer 352 has a response axis 353, the second magnetic field transducer 368 has a response axis 369, the third magnetic field transducer 355 has a response axis 357, and the fourth magnetic field transducer 365 has a response axis 367. The magnetic field transducers 352, 368, 355, 365, are responsive to magnetic fields at particular angles to the response axes 353, 369, 357, 367 as described for the response axis 13 in conjunction with FIG. 1.

A resistance, here shown to be a lumped element resistor 373 disposed on the surface 354a of the silicon substrate 354, allows the input voltage, Vin, to be applied to the input terminals 382, 384, therefore generating the current 366 through the conductor 364.

The magnetic field transducers 352, 368, 355, 365 are polarized in the same direction. The current 366 passes by the first and third magnetic field transducers 352, 355 in the opposite direction than the current 366 passes by the second and fourth magnetic field transducers 368, 365, therefore generating the first and second magnetic fields 365a, 365b in opposite directions. The second magnetic field transducer 368 is at the higher voltage side of a first resistor divider formed by the first and second magnetic field transducers 352, 368, while the third magnetic field transducer 355 is at the higher voltage side of a second resistor divider formed by the third and fourth magnetic field transducers 355, 365. Therefore, when exposed to the first and the second magnetic fields 365a, 365b that are in opposite directions, the voltage at node 370 changes in one direction and the voltage at the node 371 changes in the other direction.

The first and third magnetic field transducers 352, 355 are oriented on the silicon substrate 354 such that the response axes 353, 357 are aligned with the first magnetic field 365a. The magnetic field experienced by the first and third magnetic field transducers 352, 355 is the first magnetic field 365a. Similarly, the magnetic field experienced by the second and fourth magnetic field transducers 368, 365 is the second magnetic field 365b.

With this arrangement, the digital output voltage, Vout, is responsive to the input voltage, Vin, and is electrically isolated therefrom. More particularly, the output voltage, Vout, has a logic state dependent on whether the sensed input voltage, Vin, is greater or less than a predetermined threshold voltage.

While the open loop isolator 350 is shown having the conductor 364 disposed over the silicon substrate 354, in an alternate arrangement, the conductor 364 is disposed apart from the silicon substrate 354, yet in proximity to the magnetic field transducers 352, 368, 355, 365.

In another alternate arrangement, the first and fourth magnetic field transducers 352, 365 are polarized in the same direction as each other, but in an opposite direction from the second and third magnetic field transducers 368, 355. Accordingly, in the alternate arrangement, each conductor portion 364a, 364b is adapted to provide a current in but one direction, and the first and second magnetic fields 365a, 365b are in the same direction.

The four magnetic field transducers 352, 368, 355, 365 arranged as shown provide a Wheatstone bridge arrangement. For reasons described above in conjunction with FIG. 4, a Wheatstone bridge arrangement provides improved performance.

It should be recognized that while the open loop signal isolator 350 is shown having four magnetic field transducers 352, 368, 355, 365, in an alternate arrangement, an open loop signal isolator can have more than four or fewer than four magnetic field transducers. Also, in another alternate arrangement, the first and the second voltage sources 374, 359 can be replaced with current sources.

In yet another alternate embodiment, the comparator 390 is not provided and the amplifier 372 is coupled to the output terminal 378, thereby causing the output voltage, Vout, to be an analog output voltage. In a still further alternate embodiment, the resistor 373 is not on the silicon substrate 354, and is instead provided in series with either of the input terminals 382, 384. In another alternate embodiment, the resistor 373 is a distributed resistance (not shown) along the secondary conductor 364.

Referring now to FIG. 7, an illustrative integrated circuit package 400 is shown which is suitable for any of the electronic circuits 10, 50, 100, 150, 200, 250, 300, 350 shown in FIGS. 1, 1A, 3, 4, 5, 5A, 6, and 6A respectively. The package 400 includes two input leads 402a, 402b, as may correspond to primary conductor 18 of FIG. 1, the terminals 70, 72 of FIG. 1A, the first and second primary conductor portions 108a, 108b of FIG. 3, the first and second primary conductor portions 158a, 158b of FIG. 4, the first and second primary conductor portions 302a, 302b of FIG. 6, or the two input terminals 382, 384 of FIG. 6A.

The integrated circuit 400 includes four additional leads 404a-404d. Two of the leads 404a-404d are used to provide electrical power to the integrated circuit 400 and another two of the leads 404a-404d provide the circuit output terminals, e.g., the output terminals 32, 34 of FIG. 1, the output terminals 74, 76 of FIG. 1A, the output terminals 128, 130 of FIG. 3, the output terminals 178, 180 of FIG. 4, the output terminals 228, 230 of FIG. 5, the output terminals 278, 280 of FIG. 5A, or the output terminals 378, 380 of FIG. 6A.

The width w1 of the two input leads 402a, 402b is selected in accordance with a variety of factors, including, but not limited to the current carried by the input leads. The width w2 of the leads 404a-404d is also selected in accordance with a variety of factors including, but not limited to the current carried by the leads 404a-404d.

The integrated circuit body 406 can be comprised of plastic or any conventional integrated circuit body material. The illustrated integrated circuit 400 is but one example of packaging that can be used with the integrated sensors of the present invention. However, the packaging is not limited to any particular package type. For example, the package can be one or more of a conventional SOIC8, SOIC16, or an MLP package.

Figure 8:
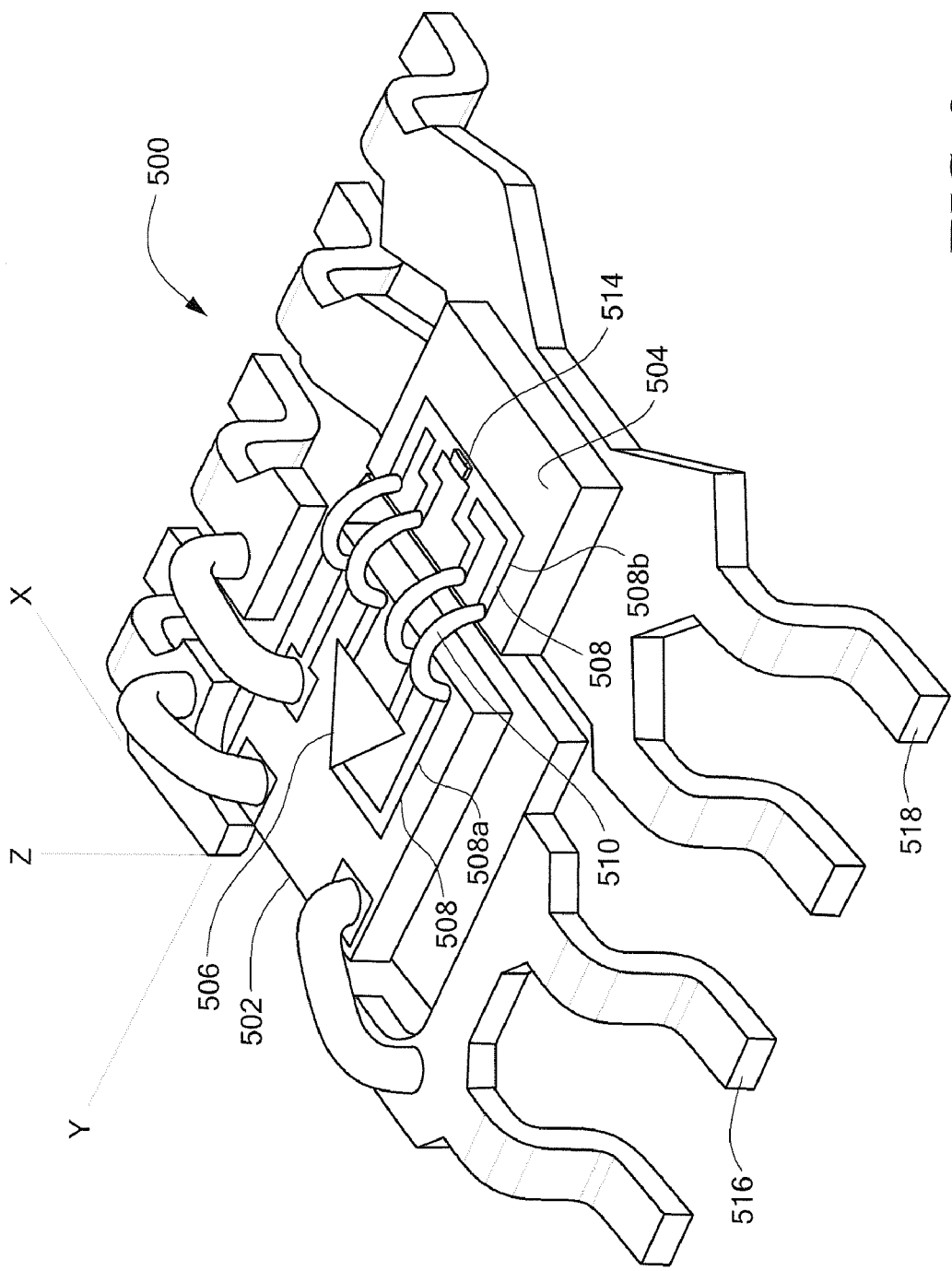
FIG. 8 is an isometric view of an alternate integrated sensor suitable for an SO8 package.

Referring now to FIG. 8, an illustrative integrated circuit 500 is used to describe an alternative packaging arrangement for any of the sensors of the present invention. While the circuit 500 is described in connection with the sensor 10 of FIG. 1, it will be appreciated by those of ordinary skill in the art that a similar package arrangement can be applied to the circuits 50, 100, 150, 200, 250, 300, 350 shown in FIGS. 1A, 3, 4, 5, 5A, 6, and 6A, respectively.

The integrated circuit 500 includes a silicon substrate 502 separate from another substrate 504, for example a ceramic substrate 504, and coupled together with wire bonds 510 or the like. The ceramic substrate 504 supports the magnetic field transducer and conductor portion required to be proximate to the transducer and the silicon substrate 502 supports the remaining circuitry and conductor portions. Specifically, substrate 502 supports amplifier 506, corresponding to amplifier 28 of FIG. 1 and the conductor portion 508a of conductor 508, corresponding to secondary conductor 26 of FIG. 1 (other than portion 26a). Substrate 504 supports magnetic field transducer 514, corresponding to transducer 12 of FIG. 1 and portion 508b of conductor 508 corresponding to secondary conductor portion 26a of FIG. 1. It will be appreciated by those of ordinary skill in the art that other divisions of circuitry between the two substrates 502, 504 are possible. The silicon substrate 502 is supported by a first lead frame 516 having leads corresponding to leads 404a-404d of FIG. 7 and the other substrate 504 is supported by a second lead frame 518 having leads corresponding to leads 402a, 402b of FIG. 7. The materials and dimensions of the lead frames 516, 518 can be tailored to the particular signals.

The modular package 500 advantageously permits the amplifier 28 to be fabricated using known silicon circuit fabrication techniques and the magnetic field transducer 514 to be fabricated using fabrication techniques suited to the other substrate 504. For example, providing a GMR 12 on a ceramic substrate 504 permits known fabrication techniques to be applied.

The first and second lead frames 516, 518 are similar to lead frame used in conjunction with conventional SOIC8 packages. However, other lead frames associated with other packages can also be used.

It should be understood that, while the integrated circuit 500 shows many of the elements of the integrated sensor 10 FIG. 1, other elements of FIG. 1 are not shown. It will, however, be readily understood how those other elements can be included in the integrated circuit 500.

Figure 9:
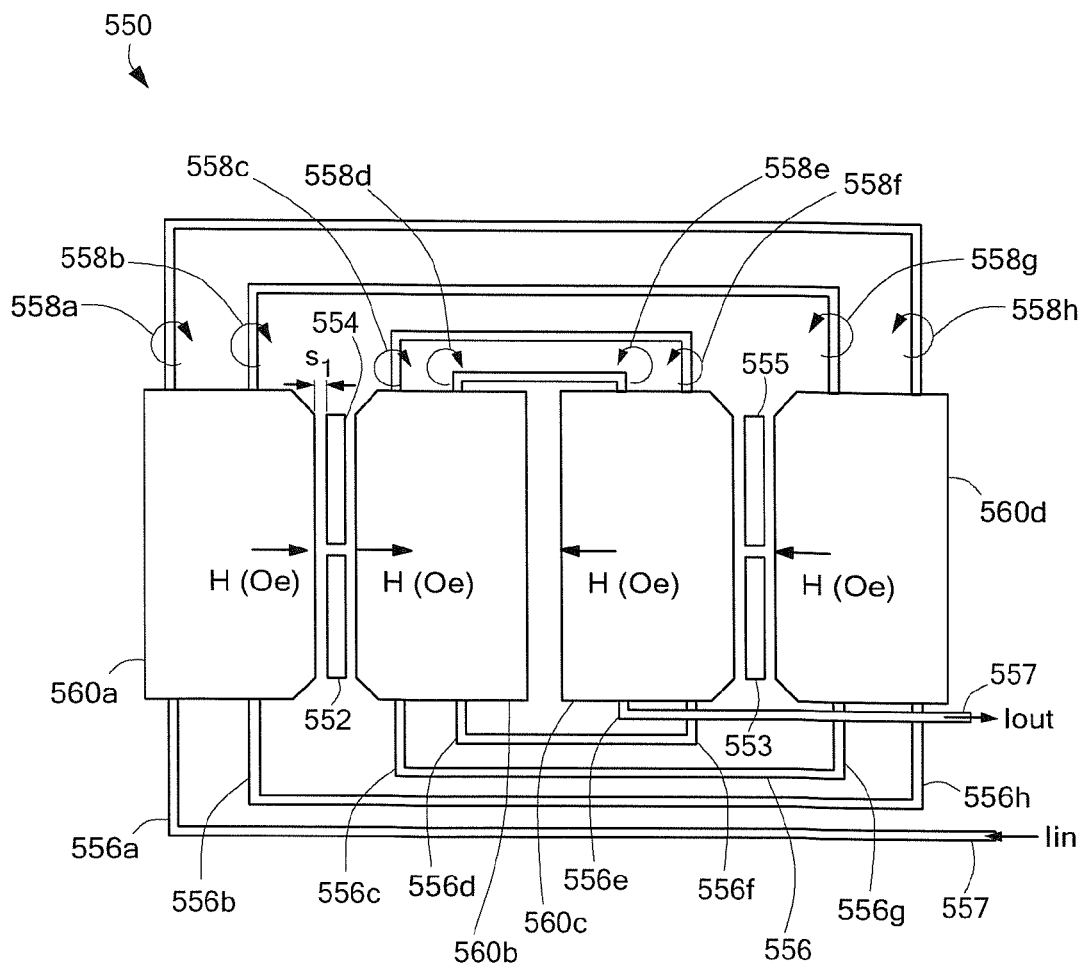
FIG. 9 is a plan view of a portion of an exemplary closed loop integrated sensor having flux concentrators in accordance with the present invention.

Referring now to FIG. 9, an electronic circuit portion 550 illustrates an alternate arrangement for a portion of the electronic circuit 150 of FIG. 4 and, in particular, an alternate arrangement for the secondary conductor 164 of FIG. 4. More particularly, the secondary conductor 164 is formed as a plurality of looped conductors. However, while the circuit portion 550 is described herein in association with the electronic circuit 150 of FIG. 4, it will be appreciated by those of ordinary skill in the art that similar techniques can be applied to other electronic circuits including, but not limited to the electronic circuits 10, 50, 100, 200, 250, 300, 350 shown in FIGS. 1, 1A, 3, 5, 5A, 6, and 6A respectively.

The electronic circuit portion 550 includes a first, second, third, and fourth magnetic field transducer 552, 553, 554, 555 respectively. The magnetic field transducers 552, 553 554, 555 can correspond, for example, to the first, second, third, and fourth magnetic field transducers 152, 168, 155, 165 of FIG. 4 respectively. The circuit portion 550 also includes a conductor 556, comprised of conductor portions 556a-556h. The conductor 556 corresponds, for example, to the secondary conductor 164 shown in FIG. 4. Here, however, the conductor 556 has four loops.

A current 557, corresponding to the secondary current 166 (FIG. 4) passes through the conductor 556, corresponding to secondary conductor 164 (FIG. 4). Four conductor portions 556a-556d are in proximity to the first and the third magnetic field transducers 552, 554 respectively such that the current 557 passes by the first and third magnetic field transducers 552, 554 in a direction that generates four magnetic fields 558a-558d in the same direction. Another four conductor sections 556e-556h are in proximity to the second and fourth magnetic field transducers 553, 555 such that the current 557 passes by the second and fourth magnetic field transducers 553, 555 in a direction that generates four magnetic fields 558e-558h in a direction opposite to the magnetic fields 558a-558d.

The four magnetic fields 558a-558d are concentrated by first and second flux concentrators 560a, 560b and the other four magnetic fields 558e-558h are concentrated by third and fourth flux concentrators 560c, 560d. The first and second flux concentrators 560a, 560b operate to concentrate the magnetic fields 558a-558d in the vicinity of the first and third magnetic field transducers 552, 554. Similarly, the third and fourth flux concentrators 560c, 560d operate to concentrate the magnetic fields 558e-558h in the vicinity of the second and fourth magnetic field transducers 553, 555. The four flux concentrators 560a-560d can be comprised of any magnetically permeable material including, but not limited to, ferrite, permalloy, and iron alloys. The four flux concentrators 560a-560d, can be fabricated in a variety of ways, including but not limited to, deposition, sputtering, and electroplating techniques.

The conductor 556, having the multiple conductor portions 556a-556h passing by each of the magnetic field transducers 552, 553, 554, 555, by itself causes each of the first, second, third, and fourth magnetic field transducers 552, 553, 554, 555 to experience essentially four times the magnetic field that they would experience if only one conductor section were to pass by each of the magnetic field transducers 552, 553, 554, 555, as with arrangement shown above in FIG. 4. The four flux concentrators 560a-560d provide an additional increase in the magnetic fields experienced by each of the magnetic field transducers 552, 553, 554, 555. Therefore, the circuit portion 550 can be used to provide the secondary conductor and the first, second, third, and fourth magnetic field transducers 552, 553, 554, 555, in an arrangement such as that shown in FIG. 4. However, it will also be appreciated that, in alternate arrangements, more than four or fewer than four magnetic field transducers can be surrounded by magnetic flux concentrators. Also, while eight conductor portions 556a-556h are shown, in other arrangements, more than eight or fewer than eight conductor portions can also be provided to yield more than four or fewer than four conductor loops.

The flux concentrators 560a-560d are separated from the magnetic field transducers by a separation s1. The separation s1 is selected in accordance with a variety of factors, including, but not limited available minimum process feature size. In one particular embodiment, the separation s1 is 5 micrometers. However, other separations can also be used with this invention.

Both the multiple conductor portions 556a-556h and the flux concentrators 560a-560d operate to enhance the ability of an amplifier, for example, the amplifier 172 of FIG. 4, to provide secondary magnetic fields 558a-558h that oppose and cancel primary magnetic fields, for example, the first and second primary magnetic fields 162a, 162b of FIG. 4. Therefore, an amplifier (e.g. amplifier 172, FIG. 4) can supply less electrical current to generate the same canceling effect, resulting in an electronic circuit that requires less power to operate.

As described above, some embodiments of the integrated sensor in accordance with the present invention can have magnetic shielding associated with magnetic field transducers. The flux concentrators 560a-560d provide a magnetic shield to external magnetic fields, for example, the earth's magnetic field.

Figure 10:
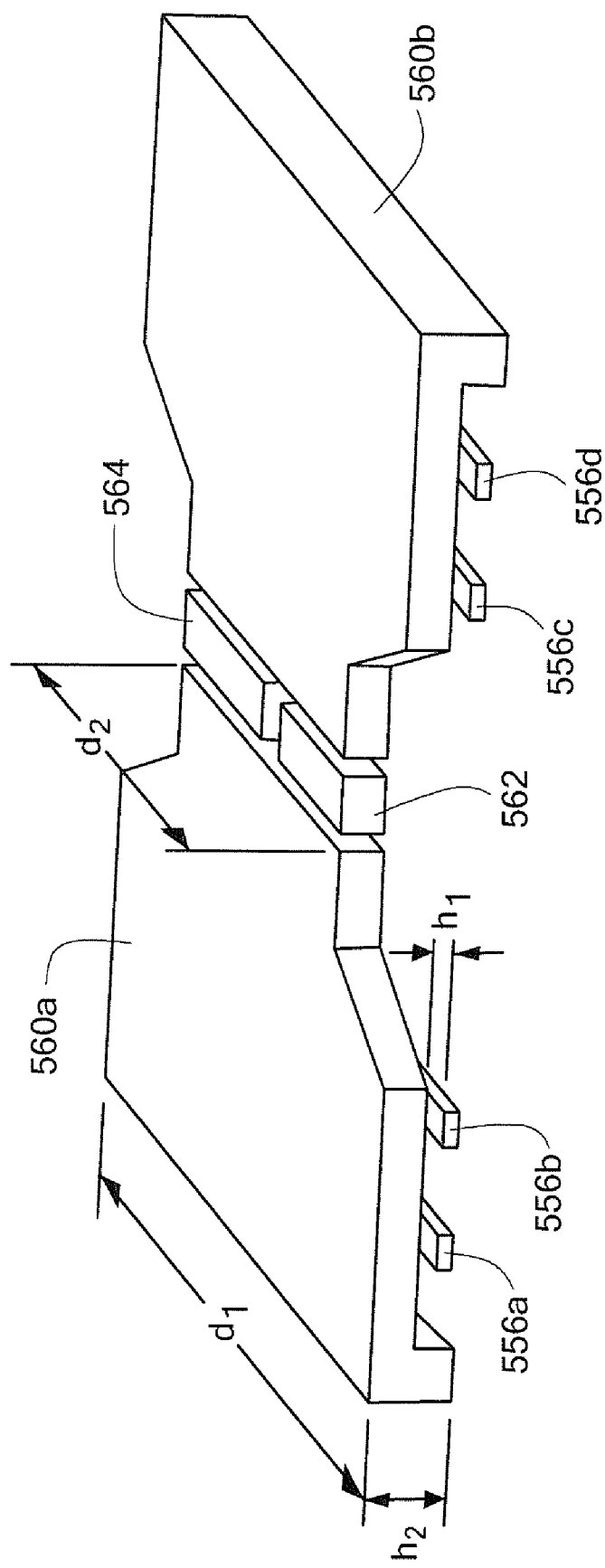
FIG. 10 is an isometric view of a portion of the circuit portion of FIG. 9.

Referring now to FIG. 10, in which like elements of FIG. 9 are shown having like reference designations, a perspective view of part of the circuit portion 550 of FIG. 9 shows that the flux concentrators 560a, 560b are spaced by a height h1 above the conductor portions 556a-556h. The height h1 is selected in accordance with a variety of factors, including, but not limited to the height of an insulating layer (not shown), which can be the same as or similar to the second insulating layer 30 of FIG. 2. In one particular embodiment, the height h1 is one micrometer. However, other heights h1 can also be used with this invention. In particular, for the isolator embodiments shown in FIGS. 6 and 6A, it may be desirable to have a greater height h1, for example four micrometers. The flux concentrators 560a, 560b have a thickness h2. In one particular embodiment the thickness h2 is five micrometers. However, other thicknesses h2 can also be used with this invention. The flux concentrators 560a, 560b have first and second depths d1, d2. In one particular embodiment, the depth d1 is 500 micrometers and the depth d2 is 300 micrometers. However, other depths d1, d2 can be used with this invention.

Having described preferred embodiments of the invention it will now become apparent to one of ordinary skill in the art that other embodiments incorporating their concepts may be used. It is felt therefore that these embodiments should not be limited to disclosed embodiments, but rather should be limited only by the spirit and scope of the appended claims. All references cited herein are hereby incorporated herein by reference in their entirety.

What is claimed is:

1. An electronic circuit, comprising:
   a first substrate having a first substrate surface;
   a device supported by said first substrate surface selected from among a passive electronic component and an active electronic component;
   a second substrate having a second substrate surface;
   a conductor proximate to said second substrate;
   a magnetic field transducer disposed over said conductor and coupled to said device; and
   an insulating layer disposed between said conductor and said second substrate, wherein said conductor is adapted to carry an electrical current to generate a first magnetic field, and wherein said electronic circuit is responsive to the first magnetic field.

2. The electronic circuit of claim 1 wherein said conductor is a secondary conductor and said circuit further comprises:
   a primary conductor disposed proximate said magnetic field transducer; and
   an insulating layer disposed between said primary conductor and said second substrate.

3. The electronic circuit of claim 2, wherein said device comprises an amplifier having an input terminal coupled to said magnetic field transducer and an output terminal coupled to said secondary conductor and at which an output signal is provided, wherein said output signal is indicative of a current through said primary conductor.

4. The electronic circuit of claim 2, wherein said primary conductor is U-shaped.

5. The electronic circuit of claim 2, wherein said secondary conductor comprises one or more loops.

6. The electronic circuit of claim 2, further including a magnetic flux concentrator disposed proximate said secondary conductor.

7. The electronic circuit of claim 1, wherein said magnetic field transducer comprises a magnetoresistance element.

8. The electronic circuit of claim 1, wherein said magnetic field transducer comprises at least two magnetoresistance elements.

9. The electronic circuit of claim 8, wherein the at least two magnetoresistance elements are polarized in opposite directions.

10. The electronic circuit of claim 8, wherein the at least two magnetoresistance elements are polarized in the same direction.

11. The electronic circuit of claim 8, wherein a voltage across a first one of the at least two magnetoresistance elements increases in response to an increase in the first magnetic field and wherein a voltage across a second one of the at least two magnetoresistance elements decreases in response to an increase in the first magnetic field.

12. The electronic circuit of claim 8, wherein a voltage across a first one of the at least two magnetoresistance elements increases in response to an increase in the first magnetic field and wherein a voltage across a second one of the at least two magnetoresistance elements increases in response to an increase in the first magnetic field.

13. The electronic circuit of claim 8, wherein the at least two magnetoresistance elements are coupled in series.

14. The electronic circuit of claim 8, wherein a response axis of each of the at least two magnetoresistance elements is substantially parallel to the first magnetic field.

15. The electronic circuit of claim 1, wherein the first substrate is comprised of silicon and the second substrate is comprised of ceramic material.

16. The electronic circuit of claim 1 wherein said conductor is a primary conductor and wherein said circuit further comprises:
   a secondary conductor disposed over said magnetic field transducer; and
   an insulting layer disposed between said magnetic field transducer and said secondary substrate.

17. An electronic circuit, comprising:
   a leadframe having a plurality of leads;
   a first substrate having first and second opposing surfaces, wherein the first substrate is coupled to the leadframe such that the second surface of the first substrate is above the leadframe and the first surface of the first substrate is above the second surface of the first substrate;
   a second substrate having first and second opposing surfaces, wherein the second substrate is coupled to the leadframe such that the second surface of the second substrate is above the leadframe and the first surface of the second substrate is above the second surface of the second substrate;
   an electronic component disposed on the first surface of the first substrate; and
   a magnetic field transducer disposed over the first surface of the second substrate and coupled to the electronic component.

18. The electronic circuit of claim 17, wherein the magnetic field transducer is a magnetoresistance element.

19. The electronic circuit of claim 17, further comprising a conductor disposed over said first surface of said second substrate, wherein said magnetic field transducer is disposed over said conductor.

20. The electronic circuit of claim 17, further comprising a conductor portion formed by a coupling of at least two of the plurality of leads proximate to the second substrate.

21. The electronic circuit of claim 17 further comprising a conductor disposed over the magnetic field transducer.

* * * * *

UNITED STATES PATENT AND TRADEMARK OFFICE
CERTIFICATE OF CORRECTION

PATENT NO. : 7,518,354 B2  Page 1 of 1
APPLICATION NO. : 11/767631
DATED : April 14, 2009
INVENTOR(S) : Jason Stauth et al.

It is certified that error appears in the above-identified patent and that said Letters Patent is hereby corrected as shown below:

Column 7, line 67 delete "layer 30" and replace with --layer 30.--.

Column 8, line 12 delete "t2, t3, t3, t4" and replace with --t2, t3, t4,--.

Column 8, line 64 delete "from" and replace with --form--.

Column 13, line 9 delete "from" and replace with --form--.

Column 13, line 39 delete "from" and replace with --form--.

Column 19, lines 42-43 delete "to lead" and replace with --to a lead--.

Column 19, line 47-48 delete "integrated sensor 10 FIG. 1," and replace with --integrated sensor 10 of FIG. 1,--.

Column 20, line 43 delete "with arrangement" and replace with --with the arrangement--.

Column 20, line 60 delete "limited available" and replace with --limited to, available--.

Column 22, line 47 delete "insulting" and replace with --insulating--.

Signed and Sealed this

Seventeenth Day of November, 2009

David J. Kappos
*Director of the United States Patent and Trademark Office*